United States Patent
Kinoshita

(10) Patent No.: US 8,130,315 B2
(45) Date of Patent: Mar. 6, 2012

(54) SOLID IMAGE CAPTURE DEVICE AND ELECTRONIC DEVICE INCORPORATING SAME

(75) Inventor: Kazuo Kinoshita, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 385 days.

(21) Appl. No.: 12/322,949

(22) Filed: Feb. 9, 2009

(65) Prior Publication Data

US 2009/0201414 A1    Aug. 13, 2009

(30) Foreign Application Priority Data

Feb. 13, 2008 (JP) .................................. 2008-32196

(51) Int. Cl.
*H04N 5/225* (2006.01)
*H01L 23/48* (2006.01)
*H05K 5/00* (2006.01)

(52) U.S. Cl. ......... 348/374; 348/376; 257/688; 361/759

(58) Field of Classification Search .................. 348/340, 348/373–376; 250/208.1; 438/64–65, 116; 257/688–689; 361/759
See application file for complete search history.

(56) References Cited

U.S. PATENT DOCUMENTS

| | | | |
|---|---|---|---|
| 5,302,778 A | 4/1994 | Maurinus | |
| 5,559,556 A | 9/1996 | Kagebeck | |
| 6,122,009 A | 9/2000 | Ueda | |
| 6,696,738 B1 * | 2/2004 | Tu et al. | 257/433 |
| 7,422,382 B2 * | 9/2008 | Seo | 396/529 |
| 7,579,583 B2 * | 8/2009 | Mok et al. | 250/239 |
| 7,733,408 B2 | 6/2010 | Tsukamoto et al. | |
| 2002/0154239 A1 | 10/2002 | Fujimoto et al. | |
| 2003/0137595 A1 | 7/2003 | Takachi | |
| 2004/0164981 A1 | 8/2004 | Fujita et al. | |
| 2004/0239793 A1 | 12/2004 | Lu et al. | |
| 2005/0212947 A1 * | 9/2005 | Sato et al. | 348/340 |
| 2005/0270405 A1 | 12/2005 | Tanida et al. | |
| 2006/0221225 A1 * | 10/2006 | Tsukamoto et al. | 348/340 |
| 2007/0035647 A1 | 2/2007 | Inuiya | |
| 2007/0267712 A1 | 11/2007 | Fujita et al. | |
| 2008/0099866 A1 * | 5/2008 | Chang et al. | 257/433 |
| 2008/0277752 A1 | 11/2008 | Fujita et al. | |
| 2009/0180013 A1 * | 7/2009 | Kinoshita | 348/308 |

FOREIGN PATENT DOCUMENTS

JP          1-57710 U         4/1989

(Continued)

OTHER PUBLICATIONS

U.S. Appl. No. 12/319,408, filed Jan. 7, 2009 by K. Kinoshita.

(Continued)

*Primary Examiner* — Daniel M Pasiewicz
(74) *Attorney, Agent, or Firm* — Edwards Wildman Palmer LLP; David G. Conlin; David A. Tucker

(57) ABSTRACT

The solid image capture device 100 in accordance with the present invention is detachably fixed to a wiring board 1 and applies pressure to the side faces of a transparent lid section 3 in a direction normal to the faces, so as to nip and secure the transparent lid section 3. The mechanism allows a solid image capture element 2 to be attached to and detached from the wiring board 1. The solid image capture element 2 is readily positioned precisely on the wiring board 1.

17 Claims, 28 Drawing Sheets

FOREIGN PATENT DOCUMENTS

| | | |
|---|---|---|
| JP | 5-259424 A | 10/1993 |
| JP | 9-284617 A | 10/1997 |
| JP | 11-261861 A | 9/1999 |
| JP | 11-331659 A | 11/1999 |
| JP | 2001-021976 A | 1/2001 |
| JP | 2001-188155 A | 7/2001 |
| JP | 2002-281400 A | 9/2002 |
| JP | 2002-320150 A | 10/2002 |
| JP | 2003-046824 A | 2/2003 |
| JP | 2003-319217 A | 11/2003 |
| JP | 2004-055959 A | 2/2004 |
| JP | 2004-289572 A | 10/2004 |
| JP | 2005-121912 A | 5/2005 |
| JP | 2005-176185 A | 6/2005 |
| JP | 2005-348275 A | 12/2005 |
| JP | 2006-005211 A | 1/2006 |
| JP | 2006-222501 A | 8/2006 |
| JP | 2007-049369 A | 2/2007 |
| JP | 2007-49458 A | 2/2007 |

OTHER PUBLICATIONS

U.S. Office Action dated Sep. 30, 2011 for U.S. Appl. No. 12/319,408.

* cited by examiner

SOLID IMAGE CAPTURE DEVICE AND ELECTRONIC DEVICE INCORPORATING SAME

This nonprovisional application claims priority under 35 U.S.C. §119(a) on Patent Application No. 2008-032196 filed in Japan on Feb. 13, 2008, the entire contents of which are hereby incorporated by reference.

FIELD OF THE INVENTION

The present invention relates to solid image capture devices and electronic devices incorporating such a device, more specifically to solid image capture devices suitably used in, for example, camera-equipped mobile phones, digital still cameras, and surveillance/security cameras for the door phone system, and various other electronics.

BACKGROUND OF THE INVENTION

Camera modules are being applied to mobile phones and Internet cameras with ever-increasing pixel counts and functionality. The improvement in pixel count and functionality is pushed by the progressively increasing pixel counts in CCD and CMOS sensor devices. Large counts of pixels are achieved by reducing the size of pixels in the sensor device. This leads to improvement in the optical mechanism, such as resolution, brightness, and auto focus and zoom functions.

Demand for mobile phones is increasing every year. A huge number of camera modules (tens to hundreds of thousands of units per month and model) is manufactured for application in mobile phones. We cannot disregard this high volume in the manufacture of camera modules. Important factors in achieving the high production volume are how to reduce the step count for easy assembly (to reduce production time) and how to reduce defective modules.

A camera module, manufactured by assembling a solid image capture element and other components, is tested before shipping. An analysis of defects found in the testing shows that they are often caused by a dark line or stain in the image captured by the camera module. These cases do not involve any malfunctioning of the module. Rather, the unwanted line and stain in the captured image is nothing more than shadow of foreign objects and dust which are present in the optical path between the solid image capture element and the internal lens in the camera module. The foreign objects and dust can come from the resin constituting the camera module housing, abrasion of assembly devices during manufacture, workers involved in manufacture, and various other sources. The line and stain should disappear if the foreign objects and dust are removed from inside the camera module or if the component to which the foreign objects or dust is sticking is replaced.

These facts indicate that approaches to defect-causing foreign objects, as well as ease in assembly, should be given consideration in camera module manufacturing.

Patent document 1, taken as an example, describes a camera module incorporating a solution to foreign objects. FIG. 36 is a plan and a cross-sectional view of a solid image capture device in accordance with patent document 1. In the camera module 400, the solid image capture element 402 has an effective pixel area 403 covered by a transparent member 404. The transparent member 404 prevents foreign objects from reaching the light receiving surface (image sensing plane) of the solid image capture element 402.

Patent document 2 describes another camera module incorporating a solution to foreign objects. FIG. 37 is a cross-sectional view of a camera module 500 in accordance with patent document 2. In the camera module 500, an exposure area 503 of a solid image capture element 502 is covered with a transparent plate 504 in an early stage in assembly to reduce adverse effects of foreign objects. Also, in the camera module 500, a sealing resin 509 seals the solid image capture element 502 and a lens holder 508 accommodating a lens 507.

Patent documents 3 and 4 disclose a camera module which is easy to assemble. FIG. 38 is an exploded oblique view of a camera module in accordance with patent document 3. FIG. 39 is an exploded oblique view of a camera module in accordance with patent document 4. A lens barrel in patent documents 3 and 4 is mounted to a wiring board without adhesive and resin sealing.

Specifically, as shown in FIG. 38, a lens 604 (lens barrel) is secured by screws 606 to a wiring board 601 to which a solid image capture element 602 is mounted in a camera module 600 of patent document 3.

Referring now to FIG. 39, in a camera module 700 of patent document 4, tabs 709 formed on a lens barrel 708 are inserted to holes 703 opened in the wiring board 701. Furthermore, a position determine pins 710 on the lens barrel 708 are inserted to receiving holes 704 opened in the wiring board 701.

Patent Document 1: Japanese Unexamined Patent Publication No. 2004-296453 (Tokukai 2004-296453; Oct. 21, 2004)

Patent Document 2: Japanese Unexamined Patent Publication No. 2006-005211 (Tokukai 2006-005211; Jan. 5, 2006)

Patent Document 3: Japanese Unexamined Patent Publication No. 2004-289572 (Tokukai 2004-289572; Oct. 14, 2004)

Patent Document 4: Japanese Unexamined Patent Publication No. 06-177271/1994 (Tokukaihei 06-177271; Jun. 24, 1994)

SUMMARY OF THE INVENTION

A problem rises where it is difficult to attach/detach the lens holder to/from the camera modules of patent documents 1 to 4.

Specifically, in the structure of patent document 1, the lens barrel needs to be sealed with resin as in patent document 2 to build camera module. Once sealed, however, the lens barrel is difficult to remove. If, for example, a defect occurs in the camera module, but not in the lens barrel, the lens barrel cannot be reused, and the entire camera module must be discarded.

Securing by screwing as in patent document 3 leads to inconsistent positioning depending on how tightly the lens 604 is screwed to the wiring board 601 and adds to the component count. Screwing also needs to be done manually, which in turn requires increased labor and production cost and severely reduced production efficiency. Manual labor is also susceptible to irregularities.

In patent document 4, precision in placement is affected by the shapes and precision of the tabs 709, the holes 703, the position determine pins 710, and the receiving holes 704.

The present invention, conceived in view of these problems, has an objective of providing a solid image capture device in which the lens barrel is readily attached to and detached from a transparent lid section and is readily fixed and precisely positioned on the transparent lid section. Another objective is to provide an electronic device incorporating the solid image capture device.

A solid image capture device in accordance with the present invention is, to solve the problems, characterized by including: a solid image capture element; a wiring board to which the solid image capture element is mounted, the wiring board including wiring for electrical connection with the solid image capture element; a transparent lid section provided over the solid image capture element to cover a light receiving section of the solid image capture element with a gap being left between the transparent lid section and the light receiving section; a lens directing external light to the light receiving section of the solid image capture element; a lens barrel accommodating the lens; and a holder securing the lens barrel onto the transparent lid section, wherein the holder presses the lens barrel when the holder is in engagement with an external section of the transparent lid section, to secure the lens barrel onto the transparent lid section.

According to this aspect of the invention, as the holder engages with the external section of the transparent lid section, the lens barrel is fixed onto the transparent lid section. The engaging holder presses the lens barrel. The engagement of the holder with the transparent lid section and the squeezing force exerted by the holder fix the lens barrel to the transparent lid section. The mechanism does not require adhesion by means of an adhesive or compression under physical pressure in securing the lens barrel to the transparent lid section. Furthermore, the holder is detachable from the transparent lid section. Should the lens barrel or the solid image capture element malfunction, it can be readily replaced.

The engagement of the holder to the transparent lid section enables positioning of the holder on the transparent lid section. This structure enables the lens barrel fixed by the holder to be placed precisely on the transparent lid section.

As detailed above, according to this aspect of the invention, the lens barrel can be attached to and detached from the transparent lid section, and the lens barrel can be readily fixed and precisely positioned on the transparent lid section. A small defect can be addressed easily by repairing or replacing the defective component so that the lens barrel can be reused. Waste and financial loss are reduced.

The solid image capture device in accordance with the present invention is preferably such that: the holder is provided on the wiring board to encase therein the solid image capture element; and the holder is detachably secured to the wiring board and applies pressure to side faces of the transparent lid section in a direction normal to the side faces, to tightly hold the transparent lid section.

According to this aspect of the invention, the holder secures the side faces of the transparent lid section in a state in which the holder is fixed to the wiring board. Furthermore, the holder presses the transparent lid section in a direction normal to the side faces of the transparent lid section. The fixing of the holder to the wiring board and the squeezing force exerted by the holder to the transparent lid section fix the solid image capture element onto the wiring board. The mechanism does not require conventional adhesion by means of an adhesive or compression under physical pressure in mounting the solid image capture element onto the wiring board. Furthermore, the holder is detachable from the wiring board. Should the wiring board or the solid image capture element malfunction, it can be readily replaced.

The fixing of the holder to the wiring board and the securing by the holder of the transparent lid section on the side faces thereof enables positioning of the holder on the wiring board. That in turn enables positioning on the wiring board of the holder encasing the solid image capture element therein.

As detailed above, the invention allows attaching/detaching of the solid image capture element to/from the wiring board, which in turn enables easy positioning of the solid image capture element on the wiring board.

The holder squeezes the transparent lid section on its side faces. The structure does not intercept the optical path from the front face (top face) of the transparent lid section to the light receiving section of the solid image capture element.

The solid image capture device in accordance with the present invention is preferably such that the holder includes contact sections each provided for a different one of the side faces of the transparent lid section to come into contact with that side face; lock sections detachably secured to the wiring board to pivotally support the contact sections; and a frame securing the contact sections when fit around the contact sections.

According to this aspect of the invention, the contact sections each provided for a different one of the side faces of the transparent lid section are pivotally supported by the lock sections. The contact sections are moved to create a greater opening than the solid image capture element. After mounting the solid image capture element to the wiring board, the opening separating the contact sections is reduced in size to less than the solid image capture element so that the contact sections come into contact with the side faces of the transparent lid section. The mechanism facilitates the mounting of the solid image capture element to the wiring board.

The solid image capture device in accordance with the present invention is preferably such that: either the holder or the solid image capture element has a connecting section for electrical connection between the holder and the solid image capture element; and the connecting section comes into contact with the holder and the solid image capture element when the transparent lid section is tightly held by the holder.

According to this aspect of the invention, a connecting section is provided which comes into contact with the holder and the solid image capture element in a state in which the transparent lid section is secured by the holder. The feature enables transmission of electrical signals from the solid image capture element to the wiring board via the connecting section when the holder is anchored to the wiring board.

According to this aspect of the invention, the holder is fixed to the wiring board by anchoring to the wiring board. Furthermore, in this anchored state, the holder presses the transparent lid section in a direction normal to a light receiving surface of the solid image capture element. The anchoring of the holder to the wiring board and the squeezing force exerted by the holder fix the solid image capture element onto the wiring board. The mechanism does not require conventional adhesion by means of an adhesive or compression under physical pressure in mounting the solid image capture element onto the wiring board. Furthermore, the holder is anchored to the wiring board, but detachable from it. Should the wiring board or the solid image capture element malfunction, it can be readily replaced.

The anchoring of the holder to the wiring board enables positioning of the holder on the wiring board. That in turn enables positioning on the wiring board of the holder encasing the solid image capture element therein.

As detailed above, the invention allows attaching/detaching of the solid image capture element to/from the wiring board, which in turn enables easy positioning of the solid image capture element on the wiring board.

The solid image capture device in accordance with the present invention is preferably such that: the holder is provided on the wiring board to encase therein the solid image capture element; and the holder is anchored to the wiring board to hold down the transparent lid section in a direction normal to a light receiving surface of the solid image capture element toward the solid image capture element.

According to this aspect of the invention, the holder is fixed to the wiring board by anchoring to the wiring board. Furthermore, in this anchored state, the holder presses the transparent lid section in a direction normal to a light receiving surface of the solid image capture element. The anchoring of the holder to the wiring board and the squeezing force exerted by the holder fix the solid image capture element onto the wiring board. The mechanism does not require conventional adhesion by means of an adhesive or compression under physical pressure in mounting the solid image capture element onto the wiring board. Furthermore, the holder is anchored to the wiring board, but detachable from it. Should the wiring board or the solid image capture element malfunction, it can be readily replaced.

The anchoring of the holder to the wiring board enables positioning of the holder on the wiring board. That in turn enables positioning on the wiring board of the holder encasing the solid image capture element therein.

As detailed above, the invention allows attaching/detaching of the wiring board to/from the solid image capture element, which in turn enables easy positioning of the solid image capture element on the wiring board.

The solid image capture device in accordance with the present invention is preferably such that: either one of the wiring board and the holder has hooks; and the other has notches with which the hooks engage.

According to this aspect of the invention, the anchoring hooks engage with the notches, anchoring the holder to the wiring board. The mechanism enables positioning of the holder and the solid image capture element on the wiring board.

The solid image capture device in accordance with the present invention preferably further includes a pedestal soldered onto the wiring board to surrounding the solid image capture element, wherein: either one of the pedestal and the holder has hooks; and the other has notches with which the hooks engage.

According to this aspect of the invention, the anchoring hooks engage with the notches, anchoring the holder to the wiring board. The mechanism enables positioning of the holder and the solid image capture element on the wiring board.

The solid image capture device in accordance with the present invention is preferably adapted so that: either the holder or the solid image capture element has a connecting section for electrical connection between the holder and the solid image capture element; and the connecting section comes into contact with the holder and the solid image capture element when the holder is anchored to the wiring board.

The structure includes a connecting section which comes into contact with the holder and the solid image capture element in a state in which the holder is anchored to the wiring board. Accordingly, the anchoring of the holder to the wiring board enables transmission of electrical signals from the solid image capture element to the wiring board via the connecting section.

The solid image capture device in accordance with the present invention is preferably adapted so that: both the wiring board and the holder have terminals; and the terminals of the wiring board and those of the holder come into contact when the holder is anchored to the wiring board.

According to this aspect of the invention, the wiring board and the holder are electrically connected only when the holder is anchored to the wiring board. The structure therefore does not allow electrical connection to be formed between the wiring board and the holder if the holder is mounted to the wiring board in a wrong way. One can hence achieve reliable positioning of the holder on the wiring board.

The solid image capture device in accordance with the present invention is preferably such that the connecting section is probe pin terminals.

The anchoring of the holder to the wiring board enables transmission of electrical signals from the solid image capture element to the wiring board via the probe pin terminals.

The solid image capture device in accordance with the present invention is preferably such that the connecting section is electrically conductive rubber. The anchoring of the holder to the wiring board enables transmission of electrical signals from the solid image capture element to the wiring board via the electrically conductive rubber.

The solid image capture device in accordance with the present invention is preferably such that the transparent lid section has a groove on its side faces; and the holder has projections which are anchored in the groove.

According to this aspect of the invention, the projections provided on the holder are anchored in the groove provided on the side faces of the transparent lid section in a state in which the transparent lid section is secured on its side faces by the holder. The structure enables high precision positioning of the holder and the solid image capture element on the wiring board.

An electronic device of the present invention contains any one of the foregoing solid image capture devices. The feature enables the solid image capture element to be attached to and detached from the wiring board. The resultant electronic device thus allows easy positioning of the solid image capture element on the wiring board.

The solid image capture device in accordance with the present invention includes a holder securing a lens barrel onto a transparent lid section. The holder presses the lens barrel so that the lens barrel is secured onto the transparent lid section when the holder is in engagement with the external section of the transparent lid section. The mechanism allows the lens barrel to be readily attached to and detached from the transparent lid section and the lens barrel to be readily fixed and precisely positioned on the transparent lid section.

DESCRIPTION OF THE EMBODIMENTS

Embodiment 1

Figure 1:
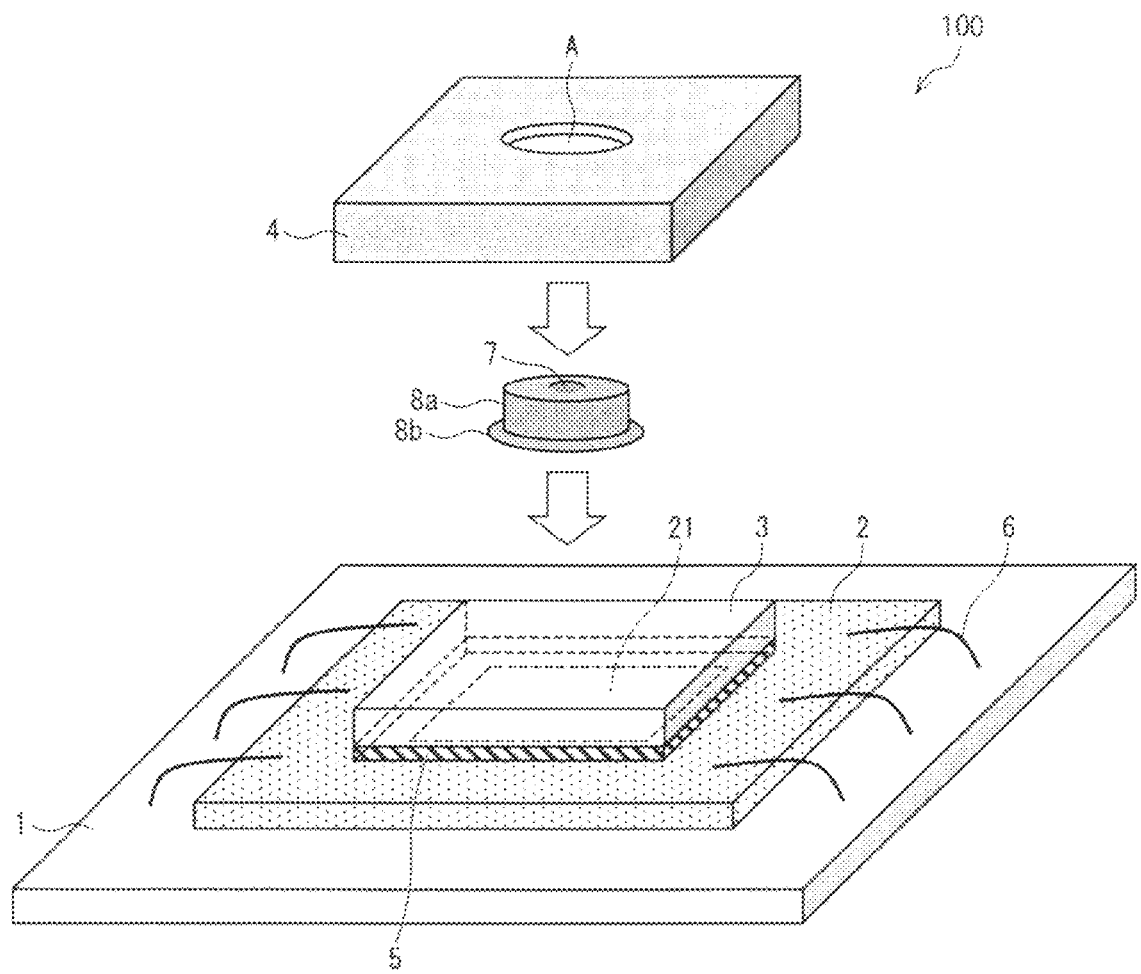
FIG. 1 is an exploded oblique view of a solid image capture device in accordance with the present invention, schematically depicting its structure.
Figure 2:
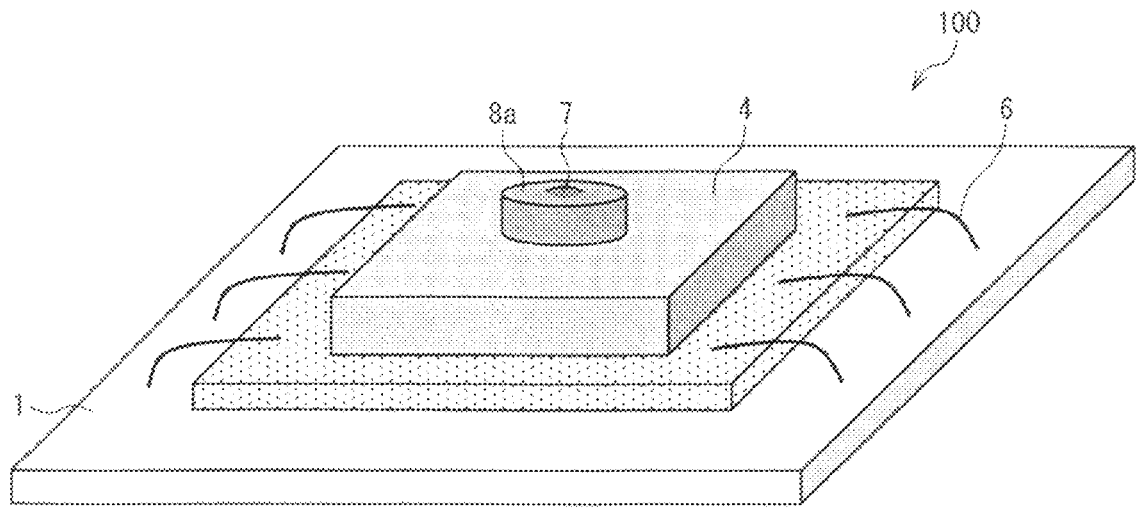
FIG. 2 is an oblique view of a solid image capture device in accordance with the present invention.

The following will describe an embodiment of the present invention in reference to figures. FIG. 1 is an exploded oblique view of a solid image capture device in accordance with the present invention, schematically depicting its structure. FIG. 2 is an oblique view of a solid image capture device in accordance with the present invention.

Referring to FIG. 1, a solid image capture device 100 contains a wiring board 1, a solid image capture element 2, a transparent lid section 3, a holder 4, a lens 7, and a lens barrel 8a. Referring next to FIG. 2, the solid image capture device 100 is adapted so that the holder 4 fixes the lens barrel 8a to the transparent lid section 3. Assume, for ease in description, that the wiring board 1 side of the device 100 (moving toward the wiring board 1) is the "down" or "bottom" side and that the lens barrel 8a side (moving away from the wiring board 1) is the "up" or "top" side.

The wiring board 1 provides an output path for electrical signals from the solid image capture element 2. The wiring board 1 is a substrate which has patterned wiring (not shown) formed thereon. The wiring and the solid image capture element 2 are connected via bonding wires to enable transmission/reception of electrical signals between them. The wiring board 1 may be, for example, a printed board, a glass epoxy board, or a ceramic board. Electrodes for external connection (not shown) are provided on the back of the wiring board 1 for electrical connection with external devices.

The solid image capture element 2 sits at the center of the wiring board 1. The element 2 is a semiconductor substrate (e.g., a monocrystal silicon substrate) having formed thereon a semiconductor circuit and appears rectangular when viewed from above. The solid image capture element 2 may be, to name a few examples, a CCD (charge-coupled device) image sensor, a CMOS (complementary metal-oxide semiconductor) image sensor, or a VMIS (threshold voltage modulation image sensor). The solid image capture element 2 has a light receiving section 21 containing an array of light receiving elements (pixels). The light receiving section 21 forms the effective pixel area (image sensing plane) for the solid image capture element 2. The light receiving section 21, being rectangular when viewed from above, sits at the center of the primary face (front face) of the solid image capture element 2. The light receiving elements convert an image of an object formed on the light receiving section 21 (light passing through the transparent lid section 3) into electrical signals.

Figure 3:
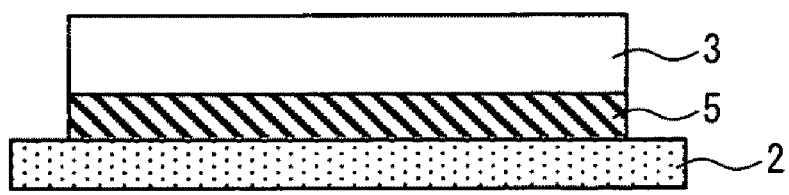
FIG. 3 is a side view of a solid image capture element and a transparent lid section in the solid image capture device shown in FIG. 1.
Figure 4:
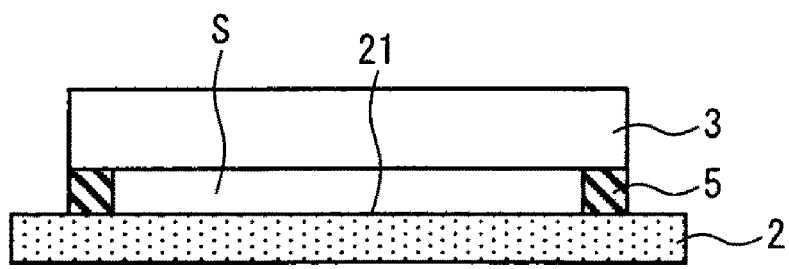
FIG. 4 is a cross-sectional view of the solid image capture element and the transparent lid section in the solid image capture device shown in FIG. 1.

The transparent lid section 3 is provided on that side face of the solid image capture element 2 on which the light receiving section 21 is formed, so as to face the light receiving section 21. In other words, the transparent lid section 3 is provided so as to cover the light receiving section 21. FIG. 3 is a side view of the solid image capture element 2 and the transparent lid section 3 in the solid image capture device 100. FIG. 4 is a cross-sectional view of the element 2 and the section 3. As shown in FIGS. 3 and 4, the transparent lid section 3 is adhered onto the solid image capture element 2 by an adhesive section 5 disposed around the light receiving section 21. The transparent lid section 3 is positioned to leave a gap S between the section 3 and the light receiving section 21. The gap S is sealed because the adhesive section 5 is disposed all around the light receiving section 21. The sealing of the gap S prevents moisture from entering the light receiving section 21 and dust from entering and sticking to the light receiving section 21. The sealing thus prevents the light receiving section 21 from developing defects. The transparent lid section 3 is made of transparent glass, transparent resin, or a like transparent material. The transparent lid section 3 may have an infrared blocking filter or like optical filter which blocks infrared light incident to the solid image capture element 2. The filter provides the transparent lid section 3 with a shielding capability from external infrared light.

The adhesive section 5 is formed by, for example, attaching a sheet of adhesive and processing the adhesive through exposure and development using photolithography technology. The use of photolithography enables high precision patterning of the adhesive section 5. The use of the sheet of adhesive gives uniform thickness to the adhesive section 5. The transparent lid section 3 is thus adhered to the light receiving section 21 with high precision.

The lens 7 and the lens barrel 8a constitute an imaging optical system which forms an image of an object. In other words, the lens 7 and the lens barrel 8a constitute an optical system which directs light from an object to form an image on the solid image capture element 2. The lens 7 has an optical axis which matches the central axis of the lens barrel 8a.

The lens barrel 8a accommodates therein the lens 7 directing external light to the light receiving section 21 of the solid image capture element 2. The lens barrel 8a is fixed on the transparent lid section 3 by the holder 4. That is, the fixing of the lens barrel 8a does not require adhesion by means of an adhesive or compression under physical pressure. Both the lens 7 and the lens barrel 8a may be made of, for example, resin.

The lens barrel 8a, in the solid image capture device 100 of the present embodiment, has a flange section 8b on the bottom section. The flange section 8b is an external extension of the lens barrel 8a on its side face, that is, an extension of the lens barrel 8a in a direction moving away from the optical path. When the holder 4 engages with an external section (periphery) of the transparent lid section 3, the lens barrel 8a falls into the opening A in the holder 4, and the holder 4 presses down the flange section 8b.

The holder 4 fixes the lens barrel 8a onto the transparent lid section 3 by pressing the lens barrel (mirror barrel) 8a. The holder 4 is adapted to engage with the external section of the transparent lid section 3, and when in engagement, fixes the lens barrel 8a. When the lens barrel 8a is fixed, the optical axis of the lens 7 (almost) matches the center of the light receiving section 21.

Specifically, the holder 4 has the opening A formed at its center section. The opening A is greater in size than the outer diameter of the lens barrel 8a and smaller than the outer diameter of the flange section 8b. The mechanism enables the lens barrel 8a to enter the opening A and press down the flange section 8b when the holder 4 engages with the external section of the transparent lid section 3. The holder 4 thus fixes the lens barrel 8a to the transparent lid section 3. In other words, when the holder 4 engages with the external section of the transparent lid section 3, the holder 4 presses the top face of the transparent lid section 3 in a direction normal to the light receiving section 21.

As detailed above, when the lens barrel 8a has the flange section. 8b, the opening A in the holder 4 has sufficient size to let the holder 4 press a part of the flange section 8b. Therefore, the size of the opening A can be given a clearance.

On the other hand, if the lens barrel 8a had no flange section 8b, the opening A in the holder 4 would have the same size as the outer diameter of the lens barrel 8a (more precisely, the opening A would have a slightly greater size than the outer diameter of the lens barrel 8a) so that the holder 4 could press the lens barrel 8a horizontally (parallel to the light receiving surface). The pressure would fix the lens barrel 8a to the transparent lid section 3. The lens barrel 8a would engage with the opening A as the transparent lid section 3 entered the holder 4. The engagement could enable precise positioning of the lens barrel 8a on the transparent lid section 3.

The holder 4 only needs to fix the lens barrel 8a to the transparent lid section 3 by pressing the lens barrel 8a when the holder 4 engages with the external section of the transparent lid section 3. Also, the holder 4 may come into contact with the front face (top face) of the transparent lid section 3 when the holder 4 engages with the external section of the transparent lid section 3. This structure enables tight fixing of the lens barrel 8a and precise positioning of the lens barrel 8a on the transparent lid section 3.

When the holder 4 is in engagement with the transparent lid section 3 in the solid image capture device 100 of the present embodiment, the transparent lid section 3 and the adhesive section 5 are encased in the holder 4 as shown in FIG. 2. The structure prevents unwanted light from reaching the light receiving section 21 of the solid image capture element 2.

Various electronic components (not shown) may be mounted on the wiring board 1 to drive the solid image capture device 100. An example of such an electronic component is a signal processing circuit which processes signals for the solid image capture element 2. Specifically, the signal processing circuit functions as a control section (image processing device) which controls operation of the solid image capture element 2 and suitably processes signal outputs of the solid image capture element 2 to produce necessary signals. The signal processing circuit may contain various electronic components: for example, an amplifier circuit section (analog signal circuit section) amplifying electrical signals obtained by conversion by the light receiving elements in the light receiving section 21 to output the amplified electrical signals as analog signals, an A/D conversion circuit section converting the analog signals to digital signals, a DSP (digital signal processor) controlling operation of the solid image capture element 2, a CPU executing various computation according to computer programs, a ROM containing the computer programs, and a RAM storing data for the various processes. Other examples of the electronic components include resistors and capacitors.

The solid image capture device 100 allows the external light picked up the lens 7 to reach the inside of the solid image capture element 2 via the transparent lid section 3 so that the light forms an image on the light receiving elements in the light receiving section 21 of the solid image capture element 2. The solid image capture device 100 contains an empty space between the light receiving section 21 and the transparent lid section 3. Therefore, the light, after passing through the transparent lid section 3, hits the light receiving section 21 without experiencing any interruption. No part of the light is lost along that particular segment of the optical path.

As detailed above, the lens barrel 8a is fixed to the transparent lid section 3 in the solid image capture device 100 when the holder 4 engages with the external section of the transparent lid section 3. Besides, the holder 4 presses the lens barrel 8a when the holder 4 is in engagement. The engagement of the holder 4 with the transparent lid section 3 and the squeezing force exerted by the holder 4 secures the lens barrel 8a onto the transparent lid section 3. Hence, the embodiment does not require adhesion by means of an adhesive or compression under physical pressure in securing the lens barrel 8a to the transparent lid section 3. Also, the holder 4 is detachable from the transparent lid section 3 (and re-attachable to the transparent lid section 3). Should the lens barrel 8a or the solid image capture element 2 malfunction, it can be readily replaced.

The engagement of the holder 4 with the transparent lid section 3 enables precise positioning of the holder 4 on the transparent lid section 3. This structure enables positioning of the lens barrel 8a fixed by the holder 4 to be placed precisely on the transparent lid section 3.

In the solid image capture device 100 according to the present embodiment as detailed above, the lens barrel 8a can be fixed onto the transparent lid section 3 without involving adhesion or compression in such a way that the lens barrel 8a can be readily attached to and detached from the transparent lid section 3, and the lens barrel 8a can be readily placed precisely on the transparent lid section 3.

Embodiment 2

Embodiment 2 will describe a solid image capture device in which the lens barrel 8a is detachable from (and re-attachable to) the transparent lid section 3 and the solid image capture element 2 is detachable from (and re-attachable to) the wiring board 1. Here, for convenience, members of the present embodiment that have the same arrangement and function as members of embodiment 1, and that are mentioned in that embodiment are indicated by the same reference numerals and description thereof is omitted.

The solid image capture element 2 in the solid image capture device 100 according to embodiment 1 is connected to the wiring board 1 via the bonding wires 6. In conventional solid image capture devices, the solid image capture element is secured to the wiring board either (physically) by adhesion or by compression. In these structures, the solid image capture element cannot be readily removed from the wiring board, and the solid image capture element cannot be readily positioned precisely on the wiring board, which leads to complex manufacturing steps. Should only one of the wiring board and the solid image capture element malfunction, it cannot be readily replaced.

The solid image capture element 2, for these reasons, is preferably adapted so that it can be readily attached to and detached from the wiring board 1. The structure does not require adhesion by means of an adhesive or compression under physical pressure in securing the wiring board 1, the solid image capture element 2, and the lens barrel 8a. Should the wiring board 1, the solid image capture element 2, or the lens barrel 8a malfunction, it can be readily replaced.

Figure 5:
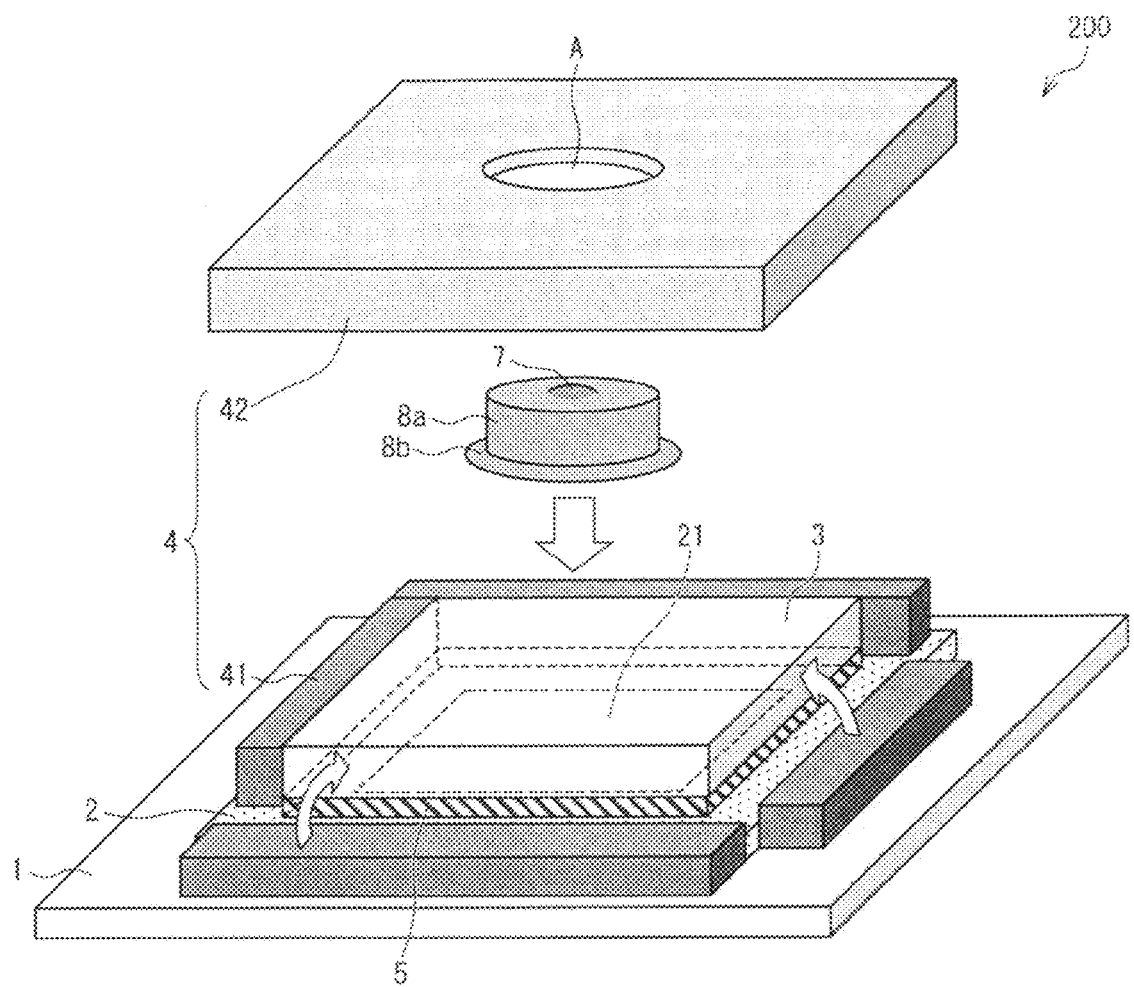
FIG. 5 is an exploded oblique view of a solid image capture device in accordance with the present invention, schematically depicting its structure.
Figure 6:
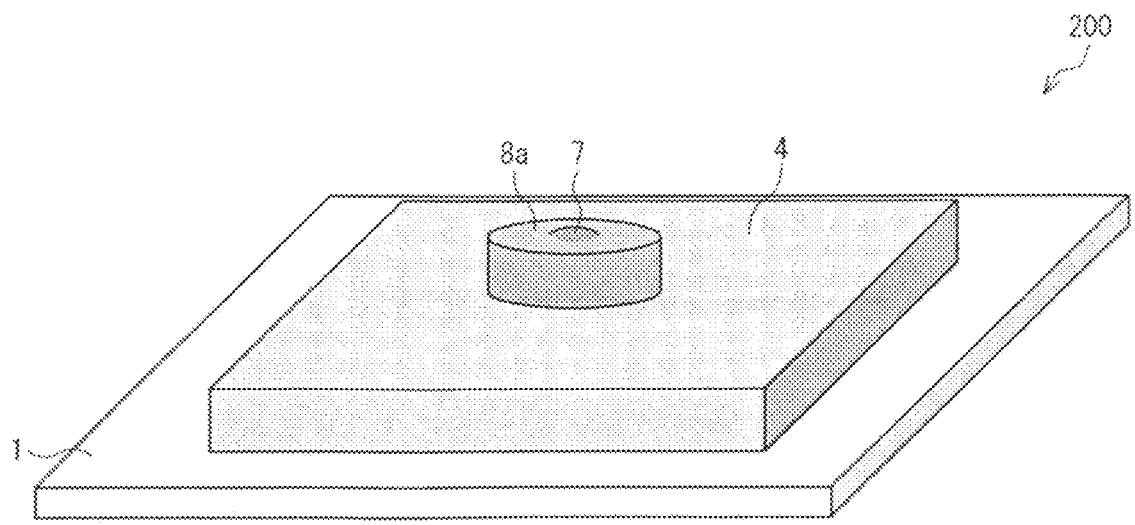
FIG. 6 is an oblique view of solid image capture device in accordance with the present invention.

A more concrete description is given. FIG. 5 is an exploded oblique view of a solid image capture device 200 in accordance with embodiment 2, schematically depicting its structure. FIG. 6 is an oblique view of the solid image capture device 200 in accordance with embodiment 2. The solid image capture device 200 has in practice the same structure as the solid image capture device 100 in accordance with embodiment 1. A difference exists in that the wire bonding 6 electrically connects the solid image capture element 2 to the wiring board 1 in the solid image capture device 100 in accordance with embodiment 1 whereas in the solid image capture device 200, the wire bonding 6 does not provided that electrical connection. In the latter, electrical signals travel from the solid image capture element 2 to the wiring board 1 via a holder 4.

As shown in FIGS. 5 and 6, in the solid image capture device 200, when the holder 4 is in engagement with the external section of the transparent lid section 3, the holder 4 presses the lens barrel 8a, thereby securing the lens barrel 8a to the transparent lid section 3, similarly to embodiment 1. Furthermore, the holder 4 in the solid image capture device 200 is detachably fixed to the wiring board 1 and applies pressure to the side faces of the transparent lid section 3 in a direction normal to the side faces so as to tightly hold the transparent lid section 3. The solid image capture element 2 is encased in the holder 4 as shown in FIG. 6. The solid image capture element 2 in the solid image capture device 200 is mounted to the wiring board 1 without involving adhesion by means of an adhesive or compression under physical pressure so that the solid image capture element 2 can be readily attached to and detached from the wiring board 1.

The holder 4 secures the lens barrel 8a to the transparent lid section 3 as in embodiment 1. The holder 4 also engages with the transparent lid section 3, is detachably fixed to the wiring board 1, and encases therein the solid image capture element 2. The holder 4 applies pressure to the side faces of the transparent lid section 3 in a direction normal to the side faces so as to squeeze the transparent lid section 3. The holder 4 holds down the top face of the transparent lid section 3 in a direction perpendicular to the light receiving section 21 (parallel to the optical axis). The holder 4 contains conductive wires (not shown) to provide electrical paths between the wiring board 1 and the solid image capture element 2. Details will be given later about how the holder 4 squeezes the transparent lid section 3 on its side faces.

The holder 4 is fixed to the wiring board 1 when the holder 4 comes into contact with the side faces of the transparent lid section 3. This mechanism enables positioning of the holder 4 relative to the transparent lid section 3. That in turn enables positioning of the solid image capture element 2 on the wiring board 1. The holder 4 squeezes the transparent lid section 3 on its side faces, leaving the front face (top face) of the transparent lid section 3 uncovered with the holder 4. The structure does not intercept the optical path up to the light receiving section 21 of the solid image capture element 2. The holder 4 is provided on the wiring board 1, skirting around the optical path up to the light receiving section 21 of the solid image capture element 2, so as to encase therein the solid image capture element 2 and the transparent lid section 3.

As detailed above, in the solid image capture device 200, the holder 4 is fixed to the wiring board 1 when the holder 4 tightly holds the transparent lid section 3 on its side faces. Besides, the holder 4 presses the transparent lid section 3 in a direction normal to the side faces of the transparent lid section 3. The fixing of the holder 4 to the wiring board 1 and the squeezing force exerted by the holder 4 onto the transparent lid section 3 fix the solid image capture element 2 to the wiring board 1. Hence, the embodiment does not require conventional adhesion (for example, by using an adhesive) or compression (under physical pressure) in mounting the solid image capture element 2 to the wiring board 1. Also, the holder 4 is detachable from the wiring board 1 (and re-attachable to the board 1). Should the wiring board 1 or the solid image capture element 2 malfunction, it can be readily replaced.

The holder 4 can be placed precisely on the wiring board 1 because the holder 4 is fixed to the wiring board 1 and tightly holds the transparent lid section 3 on its side faces. This structure enables the solid image capture element 2 disposed inside the holder 4 to be placed precisely on the wiring board 1.

In the solid image capture device 200 according to the present embodiment as detailed above, the solid image capture element 2 can be fixed onto the wiring board 1 without involving adhesion or compression, and the solid image capture element 2 can be placed precisely on the wiring board 1.

Figure 7:
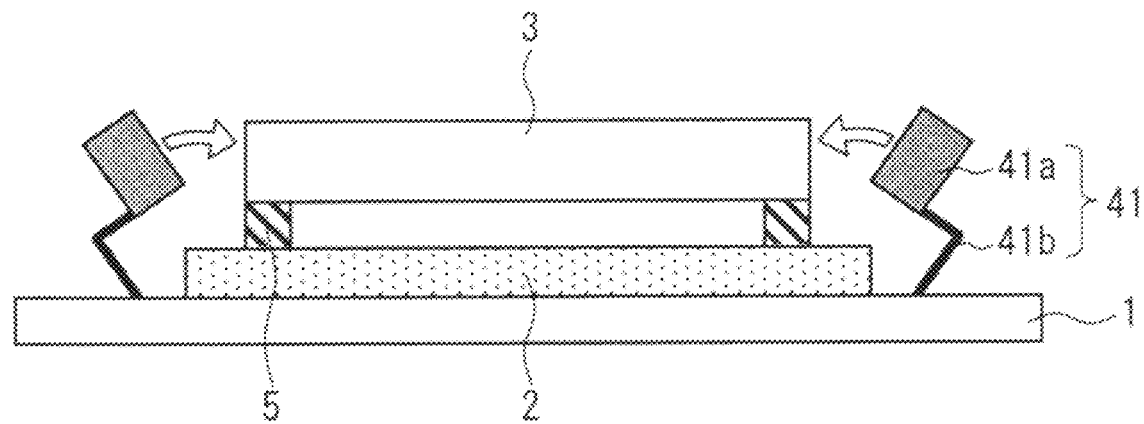
FIG. 7 is a cross-sectional view illustrating how a holder nips and holds a transparent lid section in the solid image capture device shown in FIG. 5.
Figure 7:
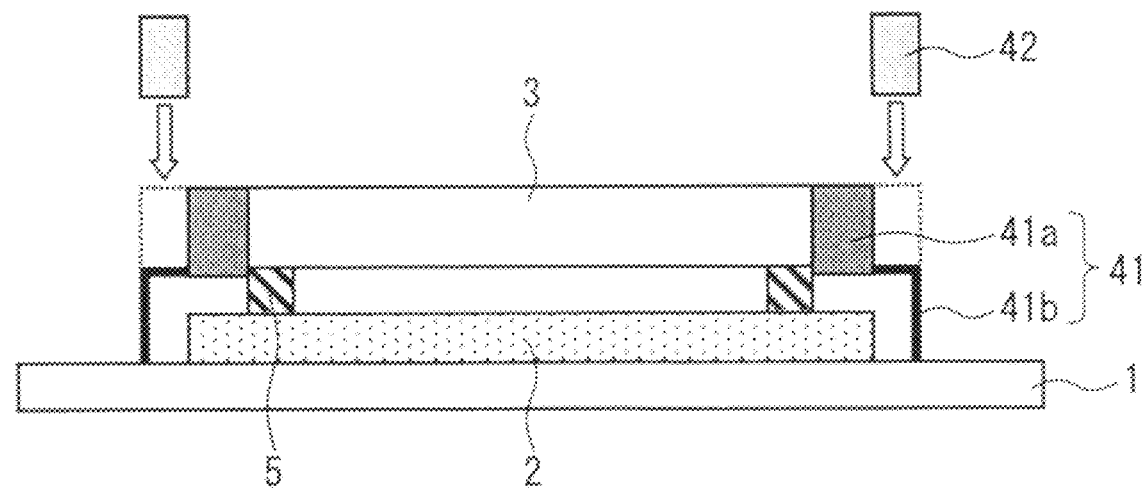

Details are now given about how the holder 4 tightly holds the transparent lid section 3 in reference to FIGS. 5 and 7. Referring to FIG. 5, the holder 4 contains lock tabs 41 locking the transparent lid section 3 and a frame 42 securing the lock tabs 41. Each lock tab 41 is physically separated from the others so that it can lock a different one of the side faces of the transparent lid section 3 in the solid image capture device 200. In other words, a lock tab 41 is provided on each of the four sides of the square transparent lid section 3 as shown in FIG. 5. The lock tab 41 comes into contact with the respective side faces of the transparent lid section 3. The frame 42 is formed to fit the outer face of the lock tabs 41 on all the four sides when moved into place.

A more concrete description is given. FIG. 7 is a cross-sectional view illustrating how the holder 4 (lock tab 41/frame 42) nips and holds the transparent lid section 3 on its side faces. As shown in FIG. 7, each lock tab 41 is provided, separately from the others, for a different one of the side faces of the transparent lid section 3. Each lock tab 41 has a contact section 41a which contacts one of the side faces and a lock section 41b pivotally supporting the contact section 41a. The lock section 41b is detachably fixed to the wiring board 1 by, for example, inserting it into a hole (not shown) in the wiring board 1.

The contact sections 41a normally exert pressure in directions indicated by arrows in the top of FIG. 7 (toward the transparent lid section 3) to secure the transparent lid section 3 on its sides. The lock sections 41b are however pliable and allow the contact sections 41a to rotate and move in directions opposite to those indicated by the arrows (away from the transparent lid section 3).

In this structure, the contact sections 41a are moved to create a greater opening than the solid image capture element 2 when mounting the solid image capture element 2 to the wiring board 1. After the mounting, the opening separating the contact sections 41a is reduced in size to less than the solid image capture element 2 so that the contact sections 41a come into contact with the side faces of the transparent lid section 3. The mechanism facilitates the mounting of the solid image capture element 2 to the wiring board 1. After securing the transparent lid section 3 with the contact sections 41a, the frame 42 is positioned in place around the contact sections 41a. The frame 42 prevents rotation of the contact sections 41a.

Figure 8:
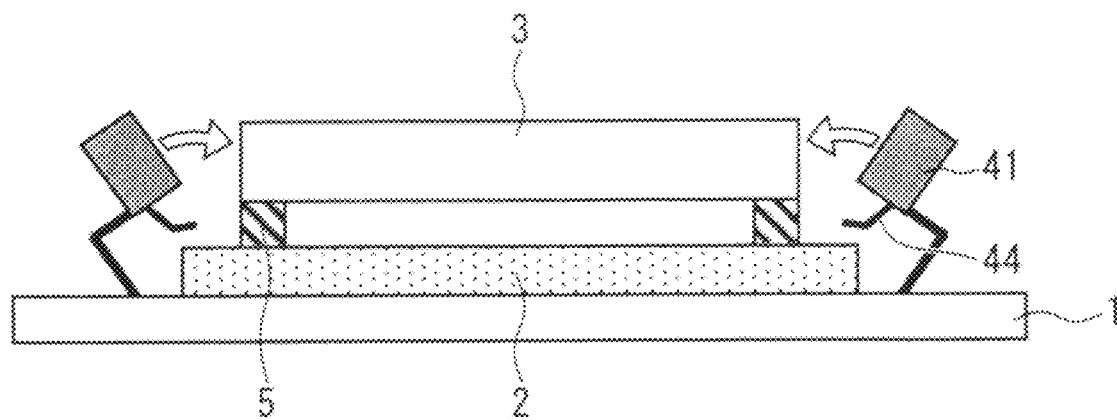
FIG. 8 is a cross-sectional view of exemplary electrical connection between a solid image capture element and the holder in the solid image capture device shown in FIG. 5.
Figure 8:
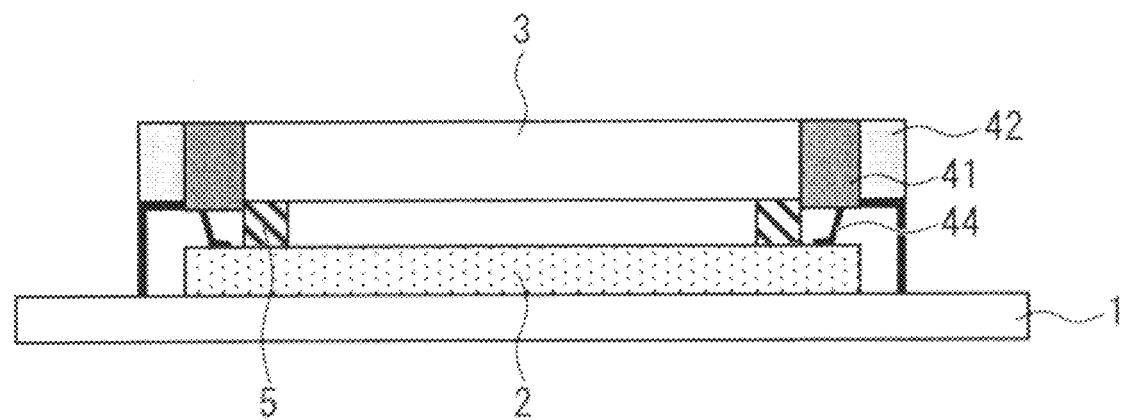
Figure 9:
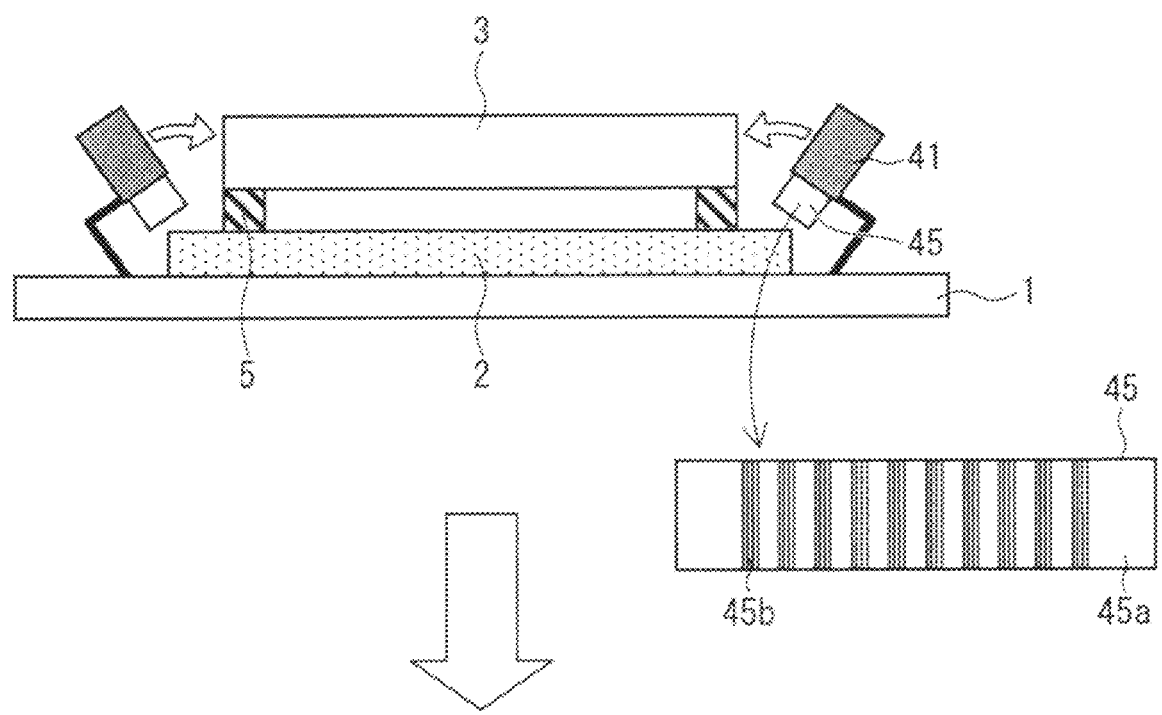
FIG. 9 is a cross-sectional view of exemplary electrical connection between a solid image capture element and the holder in the solid image capture device shown in FIG. 5.
Figure 9:
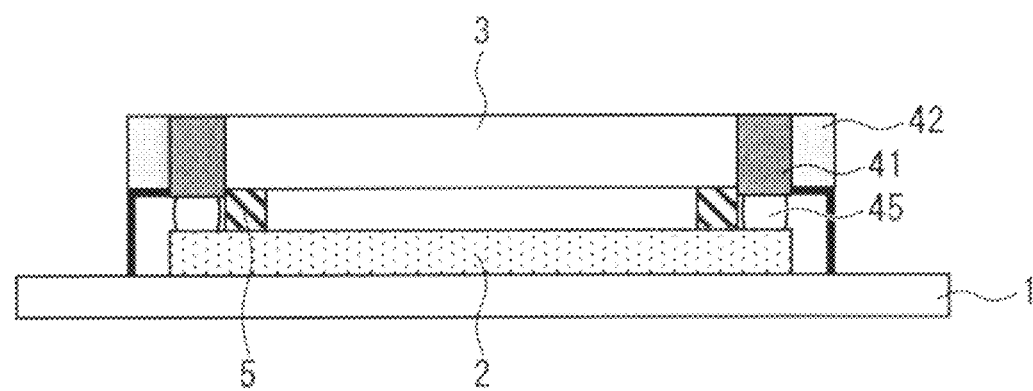
Figure 10:
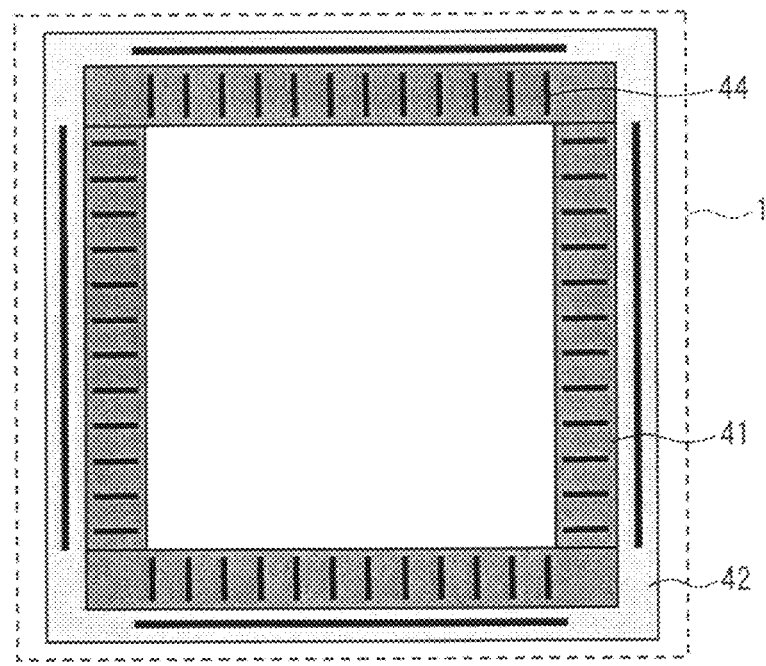
FIG. 10 is a back view of lock tabs and a frame in the solid image capture device shown in FIG. 8.
Figure 11:
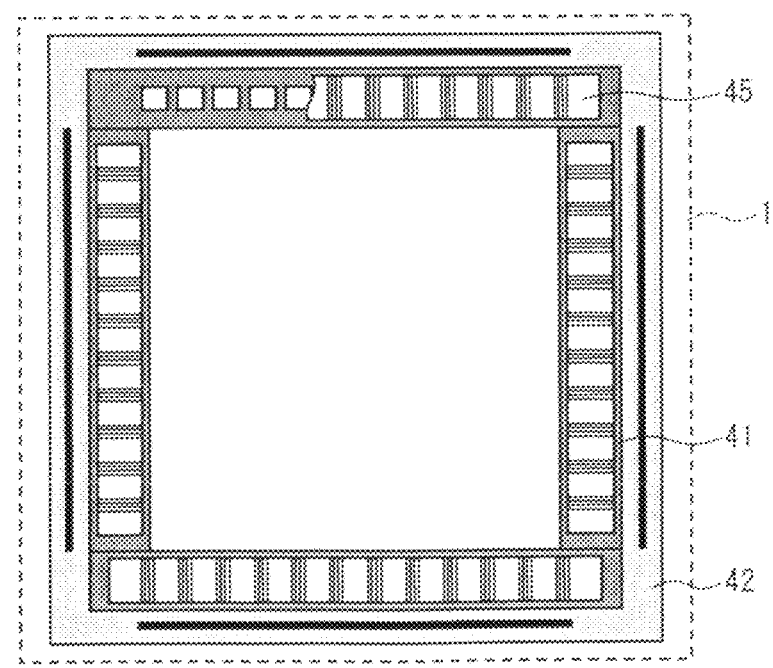
FIG. 11 is a back view of lock tabs and a frame in the solid image capture device shown in FIG. 9.

Next will be described electrical connection between the wiring board 1 and the solid image capture element 2 in the solid image capture device 200. The solid image capture device 200 is not limited in any particular manner in terms of how electrical signals should be taken out from the solid image capture element 2 and fed to the wiring board 1. For example, electrical signals from the solid image capture element 2 may be passed directly to the wiring board 1 or routed via the holder 4 before being fed to the wiring board 1. FIGS. 8 to 9 are cross-sectional views of exemplary electrical connection between the solid image capture element 2 and the holder 4 (lock tab 41). FIG. 10 is a back view of the lock tabs 41 and the frame 42 in the arrangement shown in FIG. 8. FIG. 11 is a back view of the lock tabs 41 and the frame 42 in the arrangement shown in FIG. 9. Either one of the holder 4 and the solid image capture element 2, in these arrangements, is provided with a connecting section electrically connecting the holder 4 and the solid image capture element 2. The connecting section is adapted to come into contact with the holder 4 and the solid image capture element 2 when the transparent lid section 3 is held firmly by the holder 4. The structure enables transmission of electrical signals from the solid image capture element 2 to the wiring board 1 via the connecting section.

A more concrete description is given. FIGS. 8 and 10 depict an example in which probe pin terminals 44 are used as the connecting section. The probe pin terminals 44 are formed on the back of the lock tabs 41 in FIG. 8. The probe pin terminals 44 are provided covering substantially the entire back of the lock tabs 41 as shown in FIG. 10 and comes into contact with electrode terminals (not shown) formed on the solid image capture element 2 when the transparent lid section 3 is held firmly by the holder 4 as shown in FIG. 8. The structure enables transmission of electrical signals from the solid image capture element 2 to the wiring board 1 via the probe pin terminals 44.

The use of the probe pin terminals 44 results in pressure building up on the tips of the probe pins. The pressure works in favor of setting up contacts between the probe pin terminals 44 and the electrode terminals (pad terminals) formed on the solid image capture element 2. Apart from that, the tips of the probe pin terminals 44 scratch the electrode terminals on the solid image capture element 2 upon setting up the contacts, scraping oxidation and various dirt off the surface of the electrode terminals on the solid image capture element 2. The scraping maintains the contacts between the probe pin terminals 44 and the electrode terminals on the solid image capture element 2 in good condition. Reliable contacts are thus established between the solid image capture element 2 and the wiring board 1 via the probe pin terminals 44.

FIGS. 9 and 11 depict an example in which electrically conductive rubber 45 is used as the connecting section. The electrically conductive rubber 45 is provided on the back of the lock tabs 41 in FIG. 9. The electrically conductive rubber 45 is provided covering substantially the entire back of the lock tabs 41 as shown in FIG. 10 and is composed of a resin section 45a made of rubber (elastomer) and conduction sections 45b made of multiple copper lines as schematically shown in FIG. 9. The conduction sections 45b are adapted to conduct only in the vertical direction. The structure enables transmission of electrical signals from the solid image capture element 2 to the wiring board 1 via the electrically conductive rubber 45. The inclusion of the copper lines in the conduction sections 45b enables conduction between the solid image capture element 2 and the holder 4 without having to dispose the electrically conductive rubber 45 strictly in alignment with terminals (not shown) formed for electrical connection between the solid image capture element 2 and the holder 4. The electrically conductive rubber 45, being elastic, acts as a cushion when the transparent lid section 3 is held down.

Figure 12:
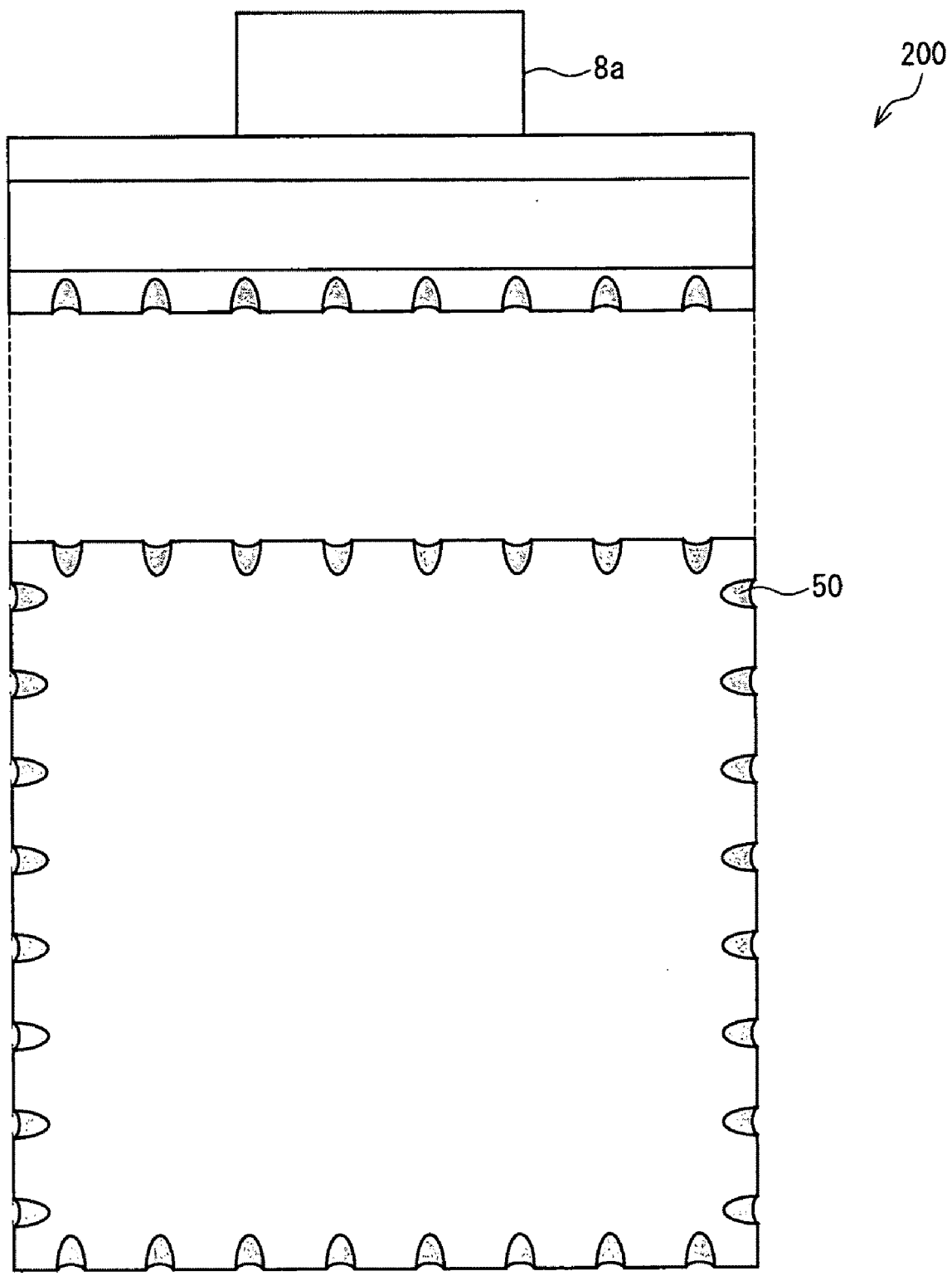
FIG. 12 is a side view and a back view of a LCC solid image capture device.
Figure 13:
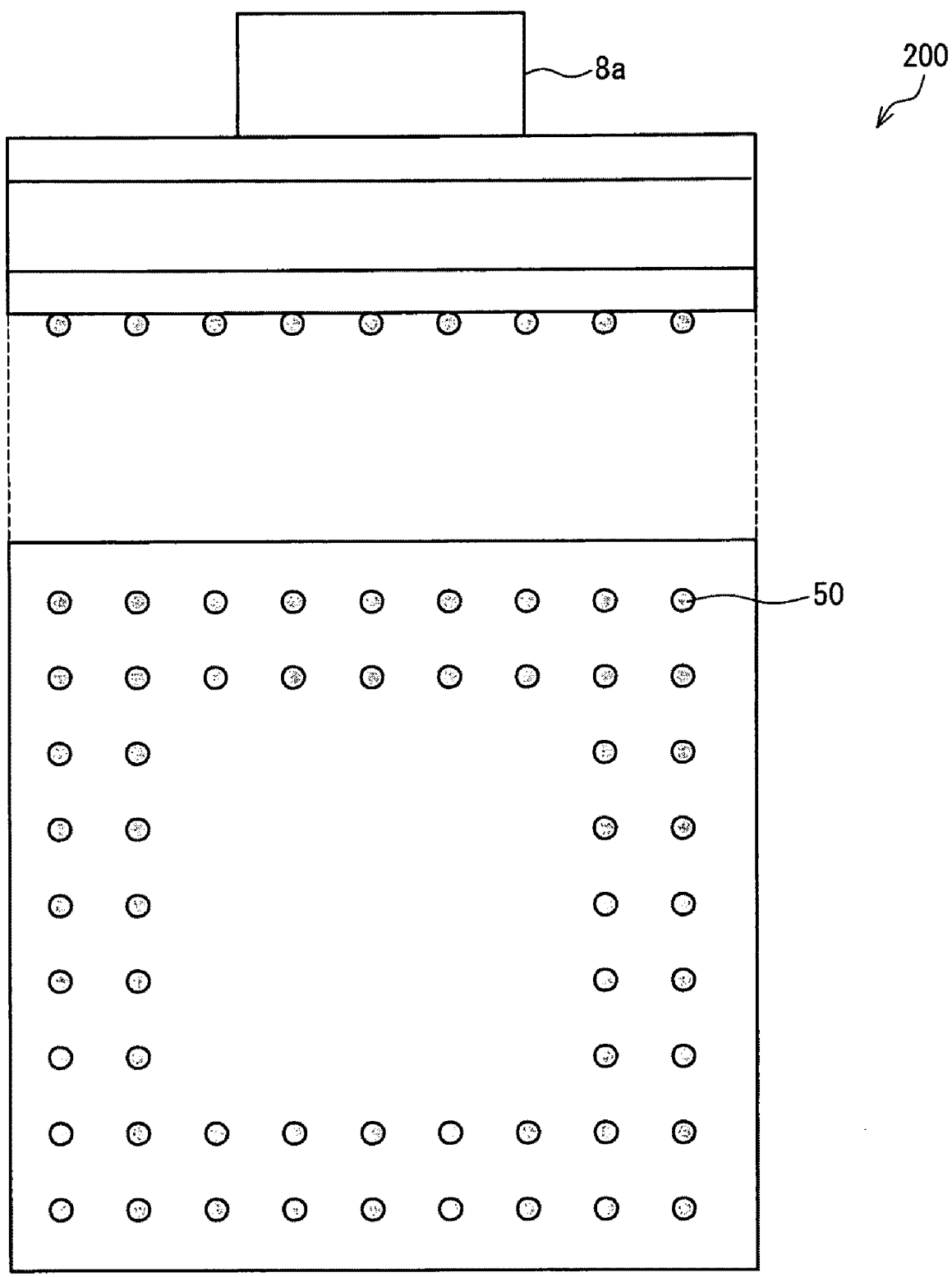
FIG. 13 is a side view and a back view of a BGA solid image capture device.

The solid image capture device 200, arranged as above, may have, for example, a LCC-like structure shown in FIG. 12 or a BGA-like structure shown in FIG. 13. FIGS. 12 and 13 are a back view and a side view of these structures. In either case, the device 200 is soldered to a substrate of various image capture devices (electronic devices) via terminals 50 provided on the back of the device 200.

As detailed above, in the solid image capture device 200, the holder 4 has the lock tabs 41 and the frame 42. The lock tabs 41 come into contact with the side faces of the transparent lid section 3 to tightly hold the transparent lid section 3.

Hence, it is the frame 42 that secures and precisely places the lens barrel 8a on the transparent lid section 3.

Figure 14:
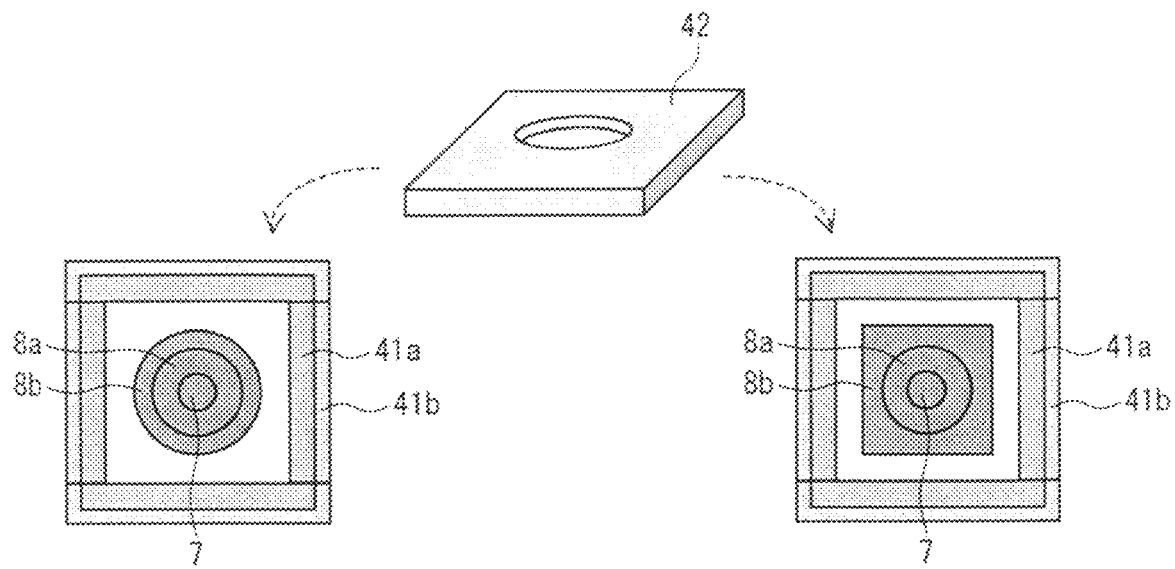
FIG. 14 is a top view of a lens barrel with a circular or rectangular flange section, placed on a transparent lid section.

A more concrete description is given. FIG. 14 is a top view of the lens barrel 8a placed on the transparent lid section 3. The lens barrel 8a has a circular or rectangular flange section 8b. The contact sections 41a come into contact with the side faces of the transparent lid section 3 to secure the transparent lid section 3 as illustrated in the figure. In this state, the contact sections 41a do not contact the lens barrel 8a or the flange section 8b. Therefore, the lens barrel 8a is not precisely placed or fixed on the transparent lid section 3. However, when the frame 42 is fit around the contact sections 41a, the lens barrel 8a enters the opening A of the frame 42, and the frame 42 presses down the flange section 8b. The lens barrel 8a is hence fixed after it is positioned on the transparent lid section 3. When the lens barrel 8a is fixed, the optical axis of the lens 7 (almost) matches the center of the light receiving section 21. The shape of the flange section 8b is not necessarily circular or rectangular.

As detailed above, the contact sections 41a in the solid image capture device 200 squeezes the transparent lid section 3 on its side faces in a state in which the lock sections 41b are fixed to the wiring board 1. The fixing of the lock tabs 41 to the wiring board 1 and the squeezing force exerted by the contact sections 41a to the transparent lid section 3 fix the solid image capture element 2 to the wiring board 1. Hence, the embodiment does not require conventional adhesion by means of an adhesive or compression under physical pressure in mounting the solid image capture element 2 to the wiring board 1. Also, the lock tabs 41 are detachable from the wiring board 1 (and re-attachable to the board 1). Should the wiring board 1 or the solid image capture element 2 malfunction, it can be readily replaced.

The fixing of the lock sections 41b to the wiring board 1 and the squeezing by the contact sections 41a of the transparent lid section 3 on its side faces enables positioning of lock tabs 41 on the wiring board 1. That in turn enables positioning of the solid image capture element 2 on the wiring board 1.

When the frame 42 is fit around the contact sections 4 1a, the lens barrel 8a enters the opening A of the frame 42, and the frame 42 presses down the flange section 8b. The frame 42 hence enables positioning of the lens barrel 8a on the transparent lid section 3.

Alternatively, when the frame 42 is fit around the contact sections 41a, the frame 42 may press the flange section 8b and come into contact with the surface of the transparent lid section 3. In that case, when the frame 42 is fit around the contact sections 41a, the frame 42 presses down the transparent lid section 3 (in a direction perpendicular to the light receiving section 21). The fixing of the lock tabs 41 to the wiring board 1, the squeezing force exerted by the contact sections 41a to the transparent lid section 3, and the downward pressure exerted by the frame 42 to the transparent lid section 3 fix the solid image capture element 2 to the wiring board 1. Therefore, the lens barrel 8a can be firmly fixed and precisely positioned on the transparent lid section 3.

Figure 15:
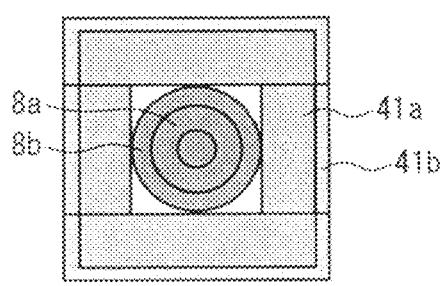
FIG. 15 is a top view of contact sections in contact with the circular flange section shown in FIG. 14.
Figure 16:
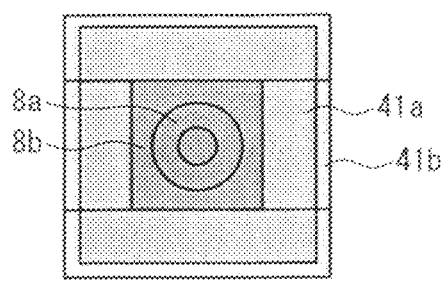
FIG. 16 is a top view of contact sections in contact with the rectangular flange section shown in FIG. 1.4.
Figure 17:
FIG. 17 is a cross-sectional view of the contact sections shown in FIGS. 15 and 16.
Figure 18:
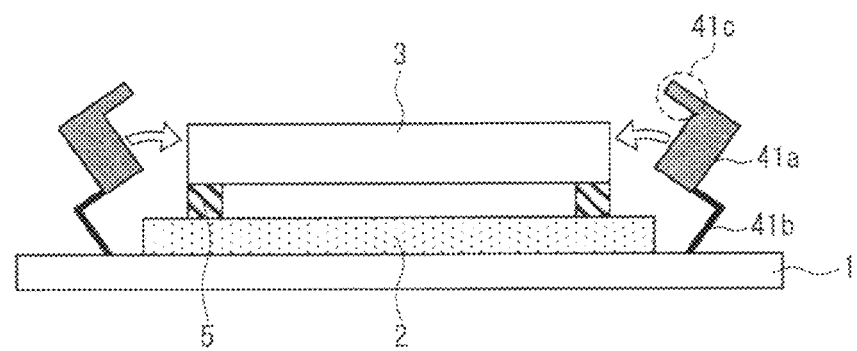
FIG. 18 is a cross-sectional view of a contact sections 41a in contact with a flange section 8b.
Figure 18:
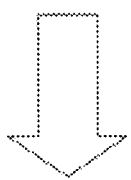
Figure 18:
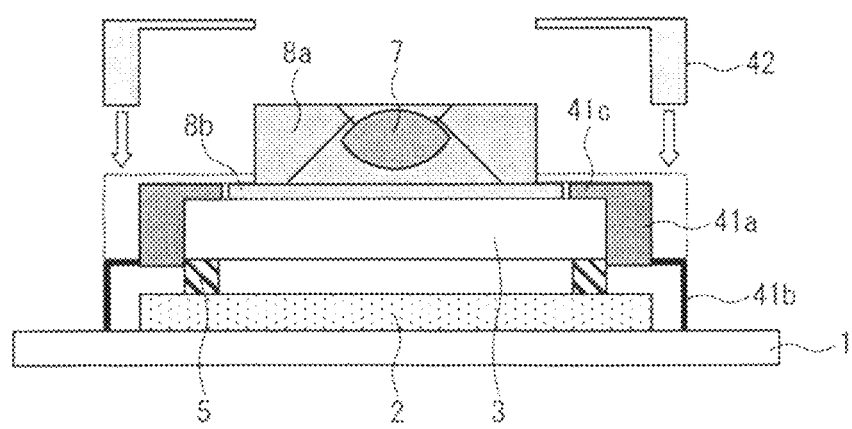

When the frame 42 is adapted to come into contact with the surface of the transparent lid section 3 as detailed above, the contact sections 41a preferably come into contact with the flange section 8b as in FIGS. 15 to 17. FIG. 15 is a top view of the contact sections 41a in contact with the circular flange section 8b shown in FIG. 14. FIG. 16 is a top view of the contact sections 41a in contact with the rectangular flange section 8b shown in FIG. 14. FIG. 17 is a cross-sectional view of the contact sections 41a shown in FIGS. 15 and 16. FIG. 18 is a cross-sectional view of the contact sections 41a which come into contact with the flange section 8b.

Referring to FIGS. 15 and 16, the contact section 41a has a contact section 41c which comes into contact with at least a part of the side face of the circular or rectangular flange section 8b. The contact section 41c is an inward extension of the top of the contact section 41a as shown in FIG. 17. The contact sections 41c come into contact with the surface of the transparent lid section 3 and a part of the flange section 8b when the contact sections 41a lock the transparent lid section 3 on its side faces as shown in FIG. 18.

The structure enables positioning of the lens barrel 8a on the transparent lid section 3 before the frame 42 is fit around the contact sections 41a. Besides, the frame 42 presses down the flange section 8b. The lens barrel 8a can be firmly fixed while being positioned precisely on the transparent lid section 3.

The structure allows for simple manufacturing steps. If the contact sections 41a have no contact sections 41c as shown in FIG. 14, the lens barrel 8a is not precisely positioned on the transparent lid section 3 without the frame 42. Therefore, when the frame 42 is fit around the contact sections 41a, the lens barrel 8a is placed in the opening A while forecasting the position of the opening A of the frame 42.

In contrast, if the contact sections 41a have contact sections 41c, the lens barrel 8a is somewhat precisely positioned on the transparent lid section 3 without the frame 42. The frame 42 is more easily fit around the contact sections 41a than in the structure of FIG. 14. The structure simplifies manufacturing steps.

Figure 19:
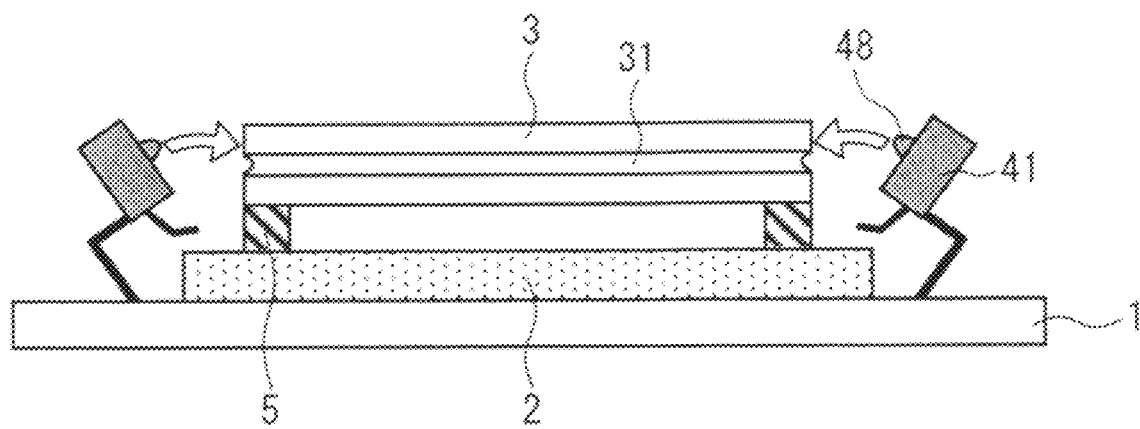
FIG. 19 is a cross-sectional view of a groove formed on a side face of a transparent lid section in a solid image capture device in accordance with the present invention.
Figure 19:
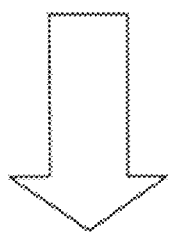
Figure 19:
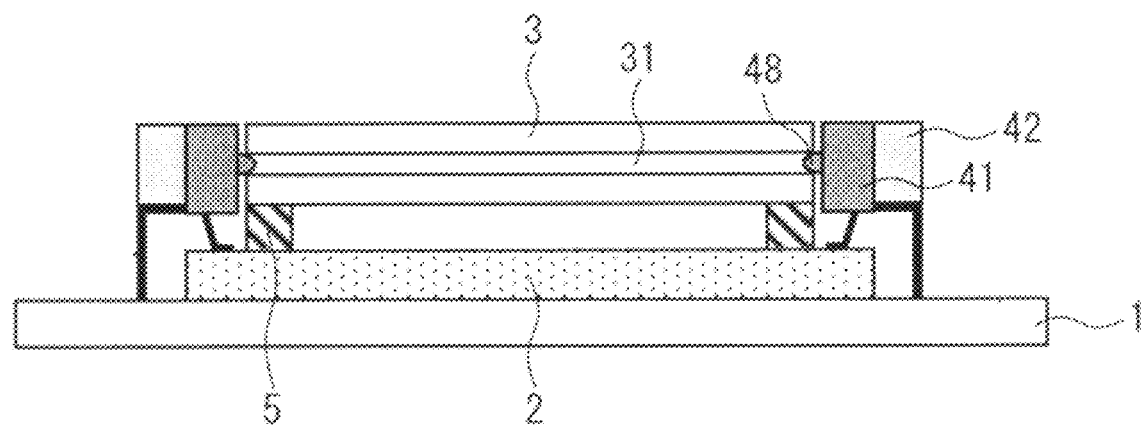

In the present embodiment, the side faces of the transparent lid section 3 have been assumed to be flat. Alternatively, the side faces of the transparent lid section 3 may have a groove 31 as shown in FIG. 19, and the holder 4 may have projections 48 which fit in the groove 31 when the holder 4 tightly holds the transparent lid section 3. The mechanism enables high precision placement of the holder 4 and the solid image capture element 2 on the wiring board 1.

Embodiment 3

Embodiment 3 will describe, similarly to embodiment 2, a solid image capture device in which the lens barrel 8a is detachable from the transparent lid section 3 and the solid image capture element 2 is detachable from the wiring board 1. Here, for convenience, members of the present embodiment that have the same arrangement and function as members of embodiments 1 and 2, and that are mentioned in that embodiments are indicated by the same reference numerals and description thereof is omitted.

The holder 4 in embodiment 2 had lock tabs 41 locking the transparent lid section 3 and a frame 42 securing the lock tabs 41. In contrast, in embodiment 3, the holder 4 has no such individual components.

Figure 20:
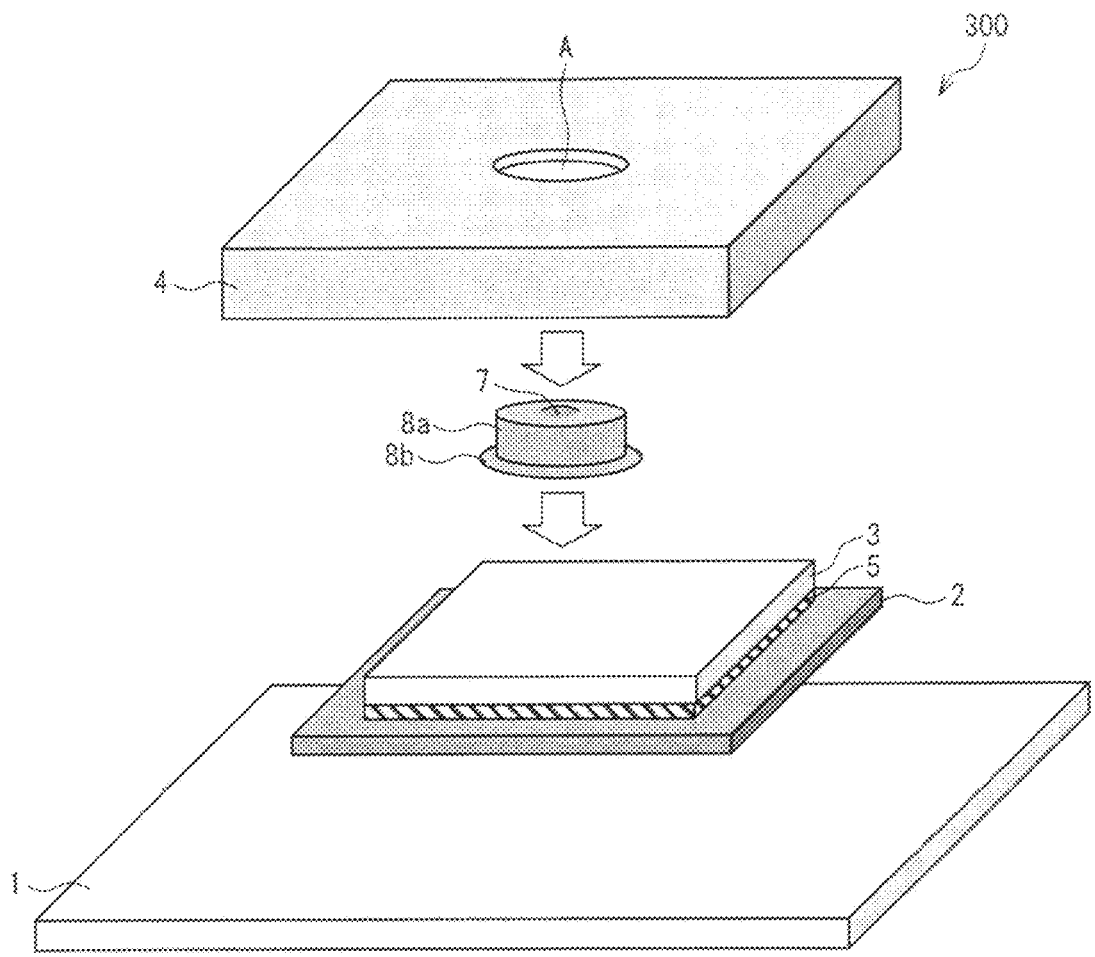
FIG. 20 is an exploded oblique view of a solid image capture device in accordance with the present invention, schematically depicting its structure.
Figure 21:
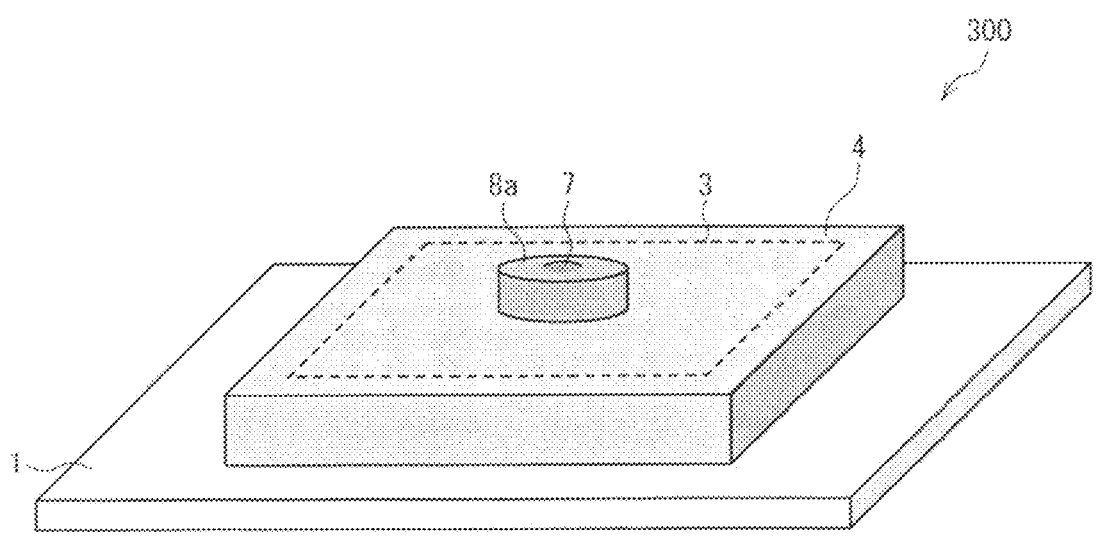
FIG. 21 is an oblique view of a solid image capture device in accordance with the present invention.

FIG. 20 is an exploded oblique view of a solid image capture device 300 in accordance with embodiment 3, schematically depicting its structure. FIG. 21 is an oblique view of the solid image capture device 300 in accordance with embodiment 3.

Referring to FIGS. 20 and 21, in the solid image capture device 300, when the holder 4 is in engagement with the external section of the transparent lid section 3, the holder 4 presses the lens barrel 8a, thereby securing the lens barrel 8a to the transparent lid section 3 similarly to embodiments 1 and 2. Furthermore, the holder 4 is anchored to the wiring board 1 and holds down the transparent lid section 3 toward the solid image capture element 2 in a direction normal to the light receiving section 21 of the solid image capture element 2. Electrical signals travel from the solid image capture element 2 to the wiring board 1 via the holder 4 in the solid image capture device 300 as in the solid image capture device 200 of embodiment 2. The solid image capture element 2 is mounted to the wiring board 1 without involving adhesion by means of an adhesive or compression under physical pressure. The solid image capture element 2 is encased in the holder 4 in the solid image capture device 300 as shown in FIG. 21.

The holder 4 is anchored to the wiring board 1 and encases the solid image capture element 2 in it. The holder 4 contains conductive wires (not shown) to provide electrical paths between the wiring board 1 and the solid image capture element 2. The holder 4 has an opening A formed at the center of its top face. The opening A is greater than the area of the light receiving section 21 of the solid image capture element 2 and smaller than the area of the top face (front face) of the transparent lid section 3. Also, the opening A is greater than the outer diameter of the flange section 8b. The holder 4, having these dimensions, holds down the transparent lid section 3 and the lens barrel. The holder 4 holds down the top face of the transparent lid section 3 toward the solid image capture element 2 in a direction perpendicular to the light receiving section 21 (parallel to the optical axis indicated by a dash-dot line in FIG. 20). As detailed above, the holder 4 biases the top face of the transparent lid section 3 and the flange section 8b downward perpendicularly.

The holder 4 comes into contact with the periphery (side faces and edges of the front face) of the transparent lid section 3 and the flange section 8b when the holder 4 is anchored to the wiring board 1. When the holder 4 is anchored, the light receiving section 21 of the solid image capture element 2 and the lens barrel 8a enter the opening A. This mechanism enables positioning of the holder 4 relative to the transparent lid section 3 and also of the lens barrel 8a relative to the transparent lid section 3. The positioning of the holder 4 on the transparent lid section 3 while the holder 4 is being anchored to the wiring board 1 enables positioning of the solid image capture element 2 on the wiring board 1. Since the light receiving section 21 of the solid image capture element 2 and the lens barrel 8a are placed in the opening A, the optical path from the lens 7 to the light receiving section 21 via the transparent lid section 3 is not intercepted. The holder 4 is provided on the wiring board 1, skirting around the optical path up to the light receiving section 21 of the solid image capture element 2. The anchoring of the holder 4 to the wiring board 1 will be detailed later.

As detailed above, in the solid image capture device 300, the holder 4 is fixed to the wiring board 1 by anchoring to the wiring board 1. Besides, the holder 4, when anchored, presses the transparent lid section 3 in a direction normal to the light receiving surface (light receiving section 21) of the solid image capture element 2. The anchoring of the holder 4 to the wiring board 1 and the squeezing force exerted by the holder 4 fix the solid image capture element 2 to the wiring board 1. Hence, the embodiment does not require conventional adhesion by means of an adhesive or compression under physical pressure in mounting the solid image capture element 2 to the wiring board 1.

Also, the holder 4 can be removed from the wiring board 1 (and re-anchored to the wiring board 1). Should the wiring board 1 or the solid image capture element 2 malfunction, it can be readily replaced.

The holder 4 can be placed precisely on the wiring board 1 because the holder 4 is anchored to the wiring board 1. This structure enables the solid image capture element 2 disposed inside the holder 4 to be placed precisely on the wiring board 1.

In the solid image capture device 300 according to the present embodiment, as detailed above, the solid image capture element 2 can be fixed onto the wiring board 1 without involving adhesion or compression, and the solid image capture element 2 can be placed precisely on the wiring board 1.

Figure 22:
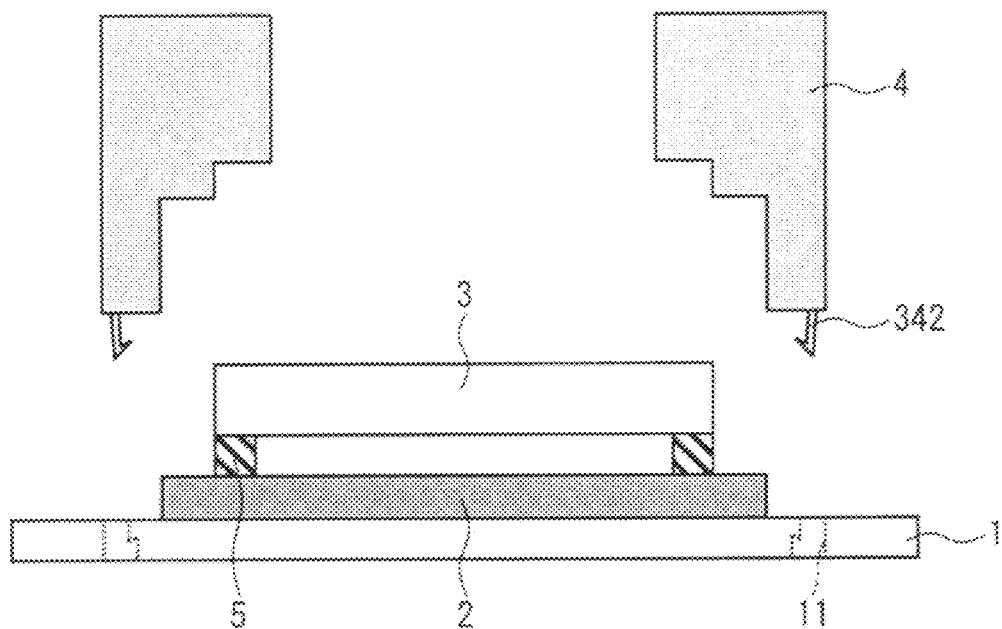
FIG. 22 is a cross-sectional view illustrating how a holder is anchored to a wiring board in the solid image capture device shown in FIG. 20.
Figure 22:
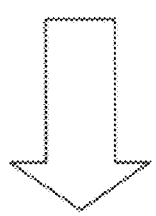
Figure 22:
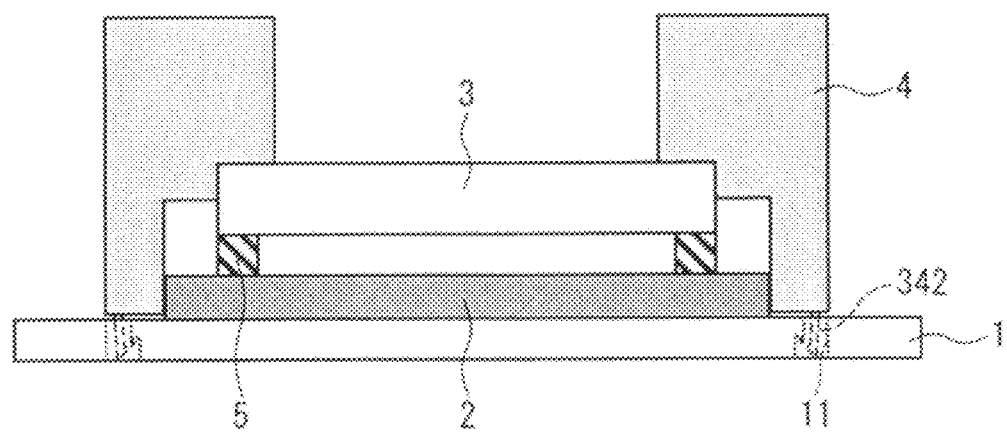
Figure 23:
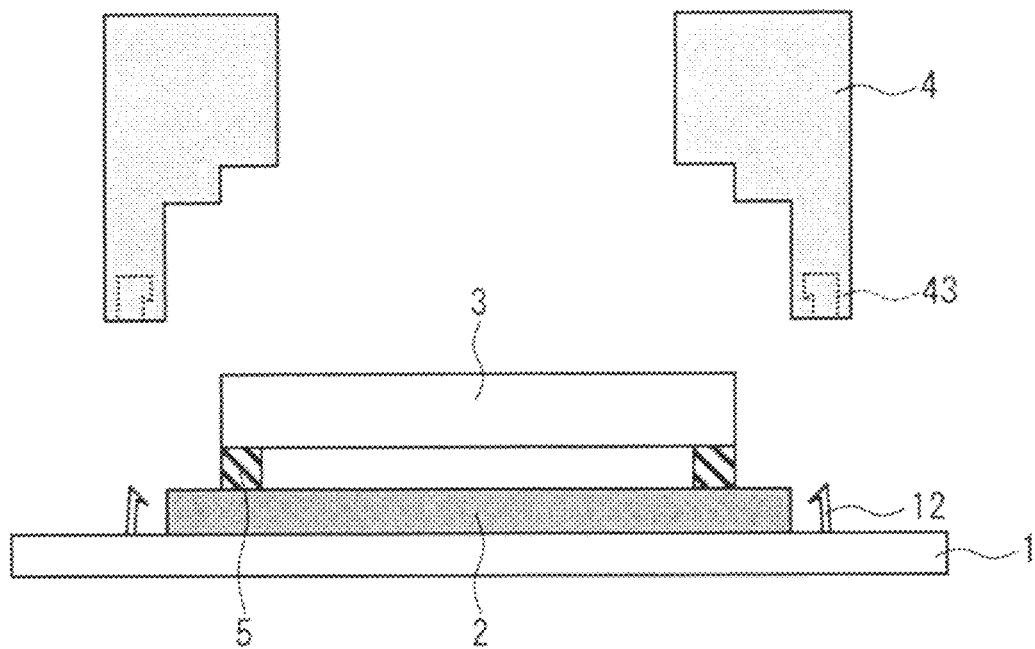
FIG. 23 is a cross-sectional view illustrating how a holder is anchored to a wiring board in the solid image capture device shown in FIG. 20.
Figure 23:
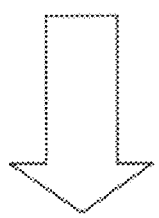
Figure 23:
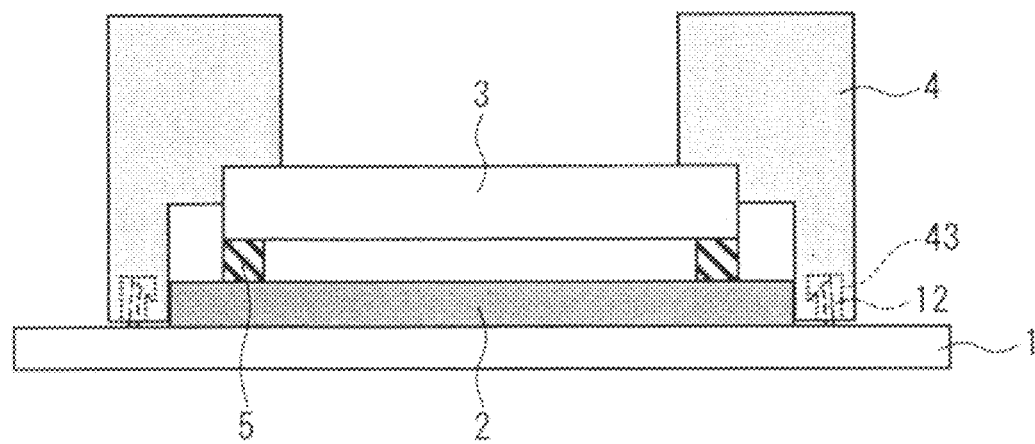
Figure 24:
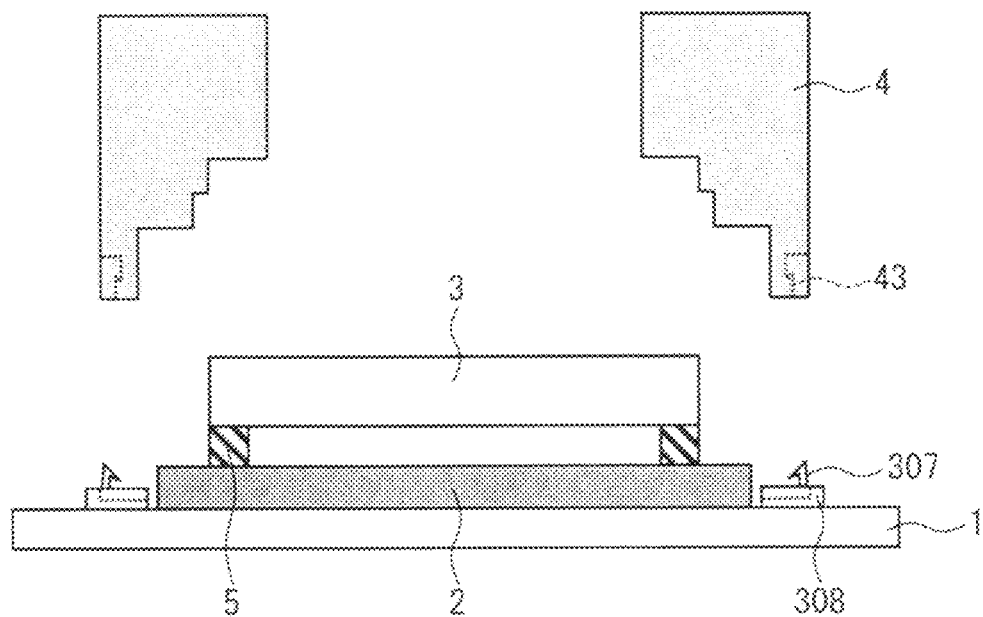
FIG. 24 is a cross-sectional view illustrating how a holder is anchored to a wiring board in the solid image capture device shown in FIG. 20.
Figure 24:
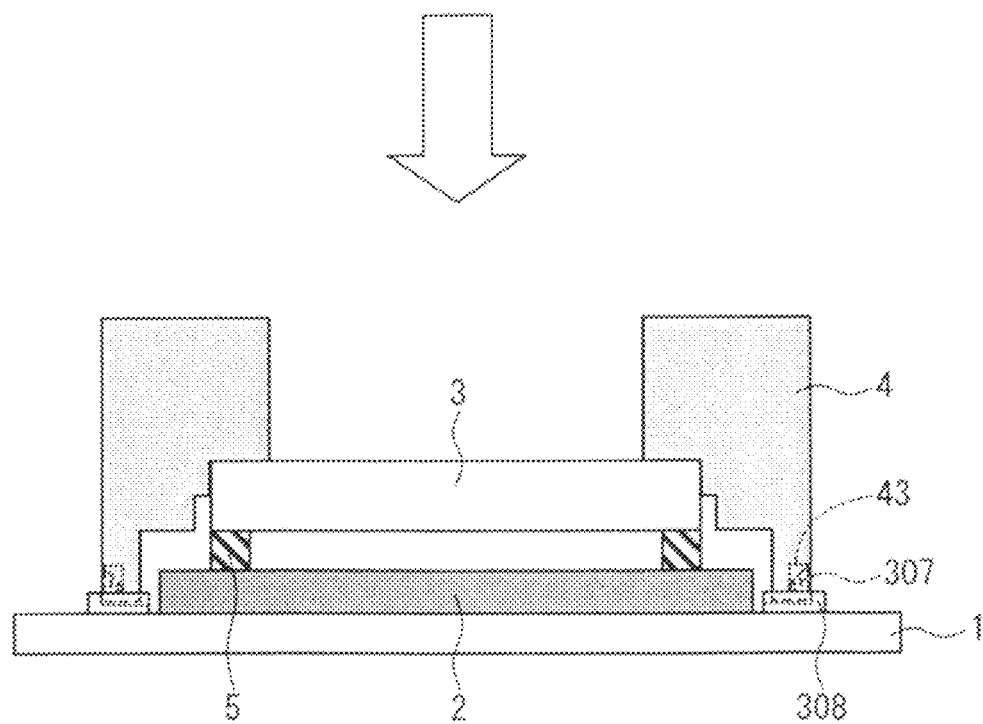

Details are now given about how the holder 4 is anchored to the wiring board 1. FIGS. 22 to 24 are cross-sectional views of the holder 4 anchored to the wiring board 1. As shown in these figures, the anchoring of the holder 4 to the wiring board 1 is achieved by, for example, hooks formed on either one of the wiring board 1 and the holder 4 and notches formed on the other one, with which the hooks engage. The anchoring enables positioning of the holder 4 on the wiring board 1.

Specifically, referring to FIG. 22, the holder 4 is provided on its bottom anchoring hooks 342. The wiring board 1 is provided with notches 11 with which the hooks 342 engage. The hooks 342, as they are caught by the notches 11, engage with the notches 11. The engagement secures the holder 4 in place on the wiring board 1. Put differently, the holder 4 is fixed to the wiring board 1 when the holder 4 is held in place on the wiring board 1. The holder 4 in this anchored state pushes down the top face of the transparent lid section 3 (moving closer to the solid image capture element 2). That in turn fixes the solid image capture element 2 to the wiring board 1 when the element 2 is precisely placed on the wiring board 1. Therefore, the solid image capture device 300 requires neither adhesive nor compression in mounting the solid image capture element 2 to the wiring board 1. Also, the anchoring of the holder 4 to the wiring board 1 allows attaching/detaching of the holder 4. Should the wiring board 1 or the solid image capture element 2 malfunction, it can be readily replaced. The hooks 342 may be formed, for example, simultaneously with the holder 4 by resin molding in a die. The structure in FIG. 22 is the simplest and easiest-to-manufacture.

The notches 11 and hooks 342 are transposed in FIG. 23 when compared with those in FIG. 22. Concretely, in FIG. 23, the wiring board 1 is provided with anchoring hooks 12, and the holder 4 is provided on its bottom with notches 43 with which the hooks 12 engage. The same effects are achieved with this structure as with the structure in FIG. 22. The hooks 12 may be formed, for example, by resin molding and fixed onto the wiring board 1. The structure in FIG. 23 is effective when the notches 11 cannot be formed on the wiring board 1 (for example, due to lack of space and required strength).

FIG. 24 depicts hooks 307 formed on a pedestal 308 in place of the hooks 12 formed on the wiring board 1 in FIG. 23. The hooks 307 engage with the notches 43 formed on the holder 4. The pedestal 308 is a frame around the solid image capture element 2 on the wiring board 1. The solid image capture element 2 is disposed inside the pedestal 308. Metal terminals (not shown) are formed on the "back" back of the pedestal 308 which contacts the wiring board 1. The pedestal 308 is surface mounted by soldering the back of the pedestal 308 to the wiring board 1. The same effects are achieved with this structure as with the structure in FIG. 22. The surface mounting of the pedestal 308 on the wiring board 1 by soldering in FIG. 24 is effective when the wiring board 1 carries other surface mounted components. The surface mounting also allows for increased freedom in the design of the wiring pattern of the wiring board 1, which leads to a lower unit price of the wiring board 1. The structure of the pedestal 308 will be detailed later.

Figure 25:
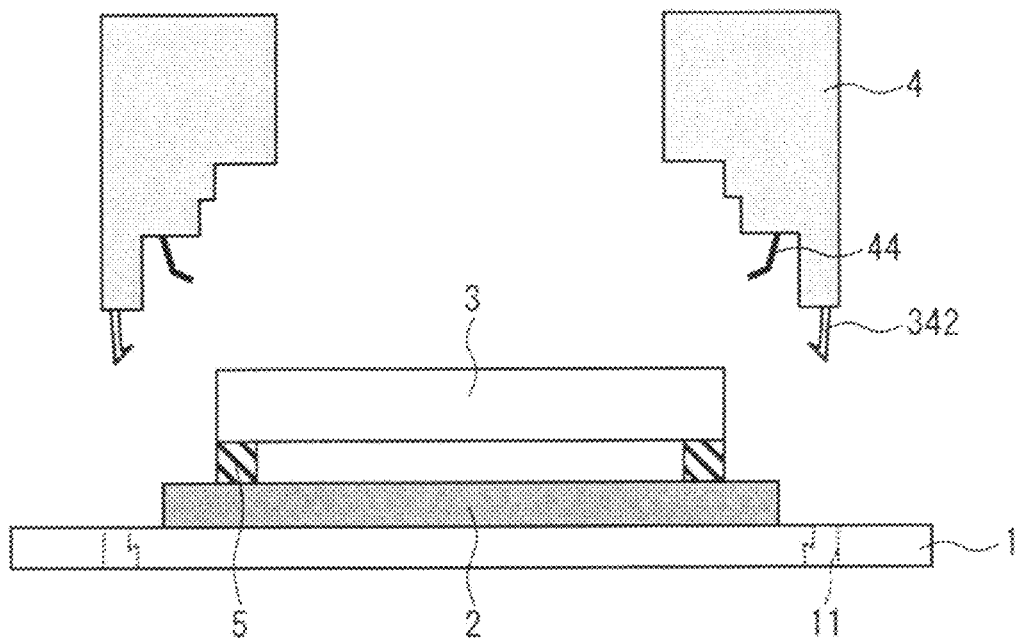
FIG. 25 is a cross-sectional view of exemplary electrical connection between a solid image capture element and a holder in the solid image capture device shown in FIG. 20.
Figure 25:
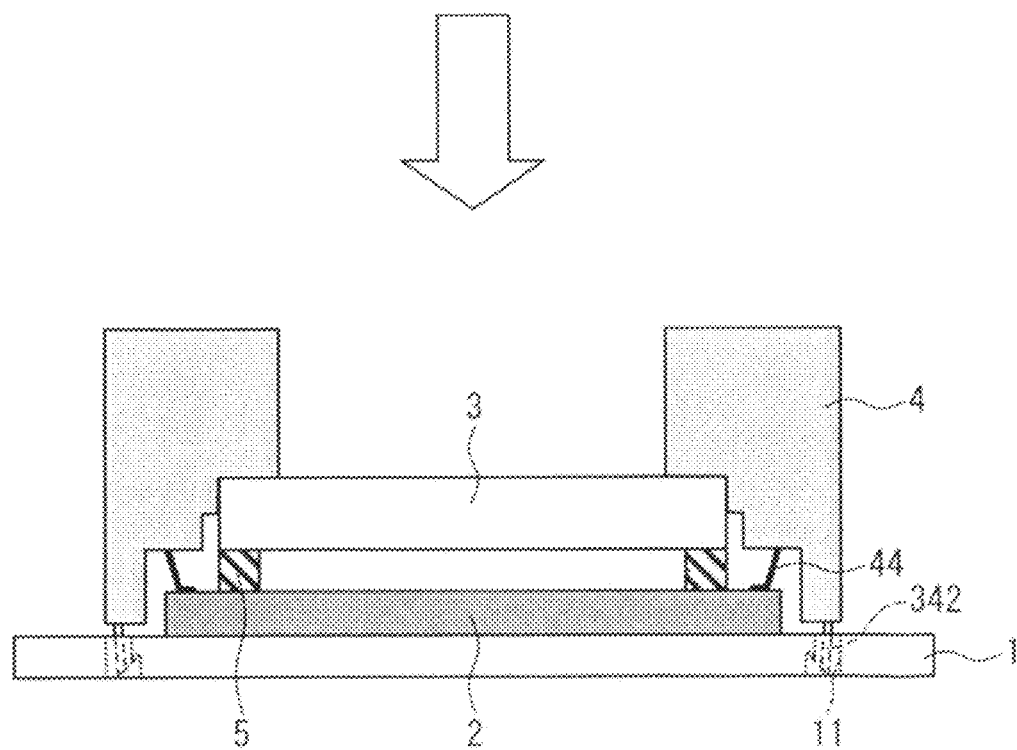
Figure 26:
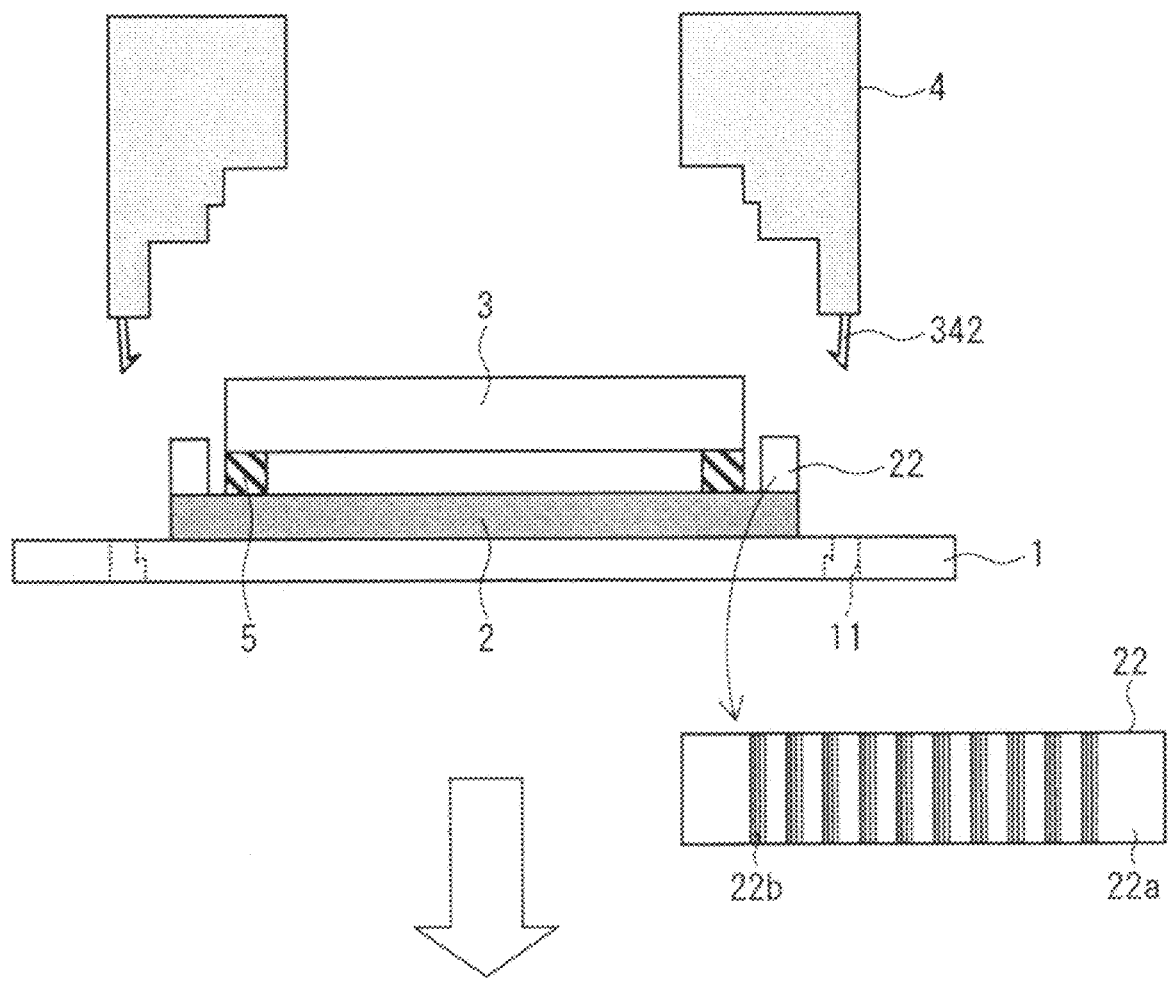
FIG. 26 is a cross-sectional view of exemplary electrical connection between a solid image capture element and a holder in the solid image capture device shown in FIG. 20.

Next will be described electrical connection between the wiring board 1 and the solid image capture element 2 in the solid image capture device 300. The solid image capture device 300 is not limited in any particular manner in terms of how electrical signals should be take out from the solid image capture element 2 and fed to the wiring board 1. For example, electrical signals from the solid image capture element 2 may be passed directly to the wiring board 1 or routed via the holder 4 before being fed to the wiring board 1. FIGS. 25 to 26 are cross-sectional views of exemplary electrical connection between the solid image capture element 2 and the holder 4. Either one of the holder 4 and the solid image capture element 2, in these arrangements, is provided with a connecting section electrically connecting the holder 4 and the solid image capture element 2. The connecting section is adapted to come into contact with the holder 4 and the solid image capture element 2 when the holder 4 is anchored to the wiring board 1. The structure enables transmission of electrical signals from the solid image capture element 2 to the wiring board 1 via the connecting section.

A more concrete description is given. FIG. 25 depicts an example in which probe pin terminals 44 are used as the connecting section. The probe pin terminals 44 are formed on an internal face of the holder 4 in FIG. 25. The probe pin terminals 44 come into contact with electrode terminals (not shown) formed on the solid image capture element 2 when the holder 4 is anchored to the wiring board 1. The structure enables transmission of electrical signals from the solid image capture element 2 to the wiring board 1 via the probe pin terminals 44.

The use of the probe pin terminals 44 results in pressure building up on the tips of the probe pins. The pressure works in favor of setting up contacts between the probe pin terminals 44 and the electrode terminals (pad terminals) formed on the solid image capture element 2. Apart from that, the tips of the probe pin terminals 44 scratch the electrode terminals on the solid image capture element 2 upon setting up the contacts, scraping oxidation and various dirt off the surface of the electrode terminals on the solid image capture element 2. The scraping maintains the contacts between the probe pin terminals 44 and the electrode terminals on the solid image capture element 2 in good condition. Reliable contacts are thus established between the solid image capture element 2 and the wiring board 1 via the probe pin terminals 44.

FIG. 26 depicts an example in which electrically conductive rubber 22 is used as the connecting section. The electrically conductive rubber 22 is provided outside and along the adhesive section 5 on the solid image capture element 2 as shown in FIG. 26 and is composed of a resin section 22a made of rubber (elastomer) and conduction sections 22b made of multiple copper lines as schematically shown in FIG. 26. Thing conduction sections 22b are adapted to conduct only in the vertical direction. The structure enables transmission of electrical signals from the solid image capture element 2 to the wiring board 1 electrically conductive rubber 22. The inclusion of the copper lines in the conduction sections 22b enables conduction between the solid image capture element 2 and the holder 4 without having to dispose the electrically conductive rubber 22 strictly in alignment with terminals (not shown) formed for electrical connection between the solid image capture element 2 and the holder 4. The electrically conductive rubber 22, being elastic, acts as a cushion when the transparent lid section 3 is held down too much by the holder 4. The electrically conductive rubber 22 therefore reliably prevents the transparent lid section 3 from breaking.

FIGS. 25 and 26 depict the holder 4 anchored to the wiring board 1 similarly to the structure in FIG. 22. The structures in FIG. 23 and FIG. 24 may be employed instead.

Figure 27:
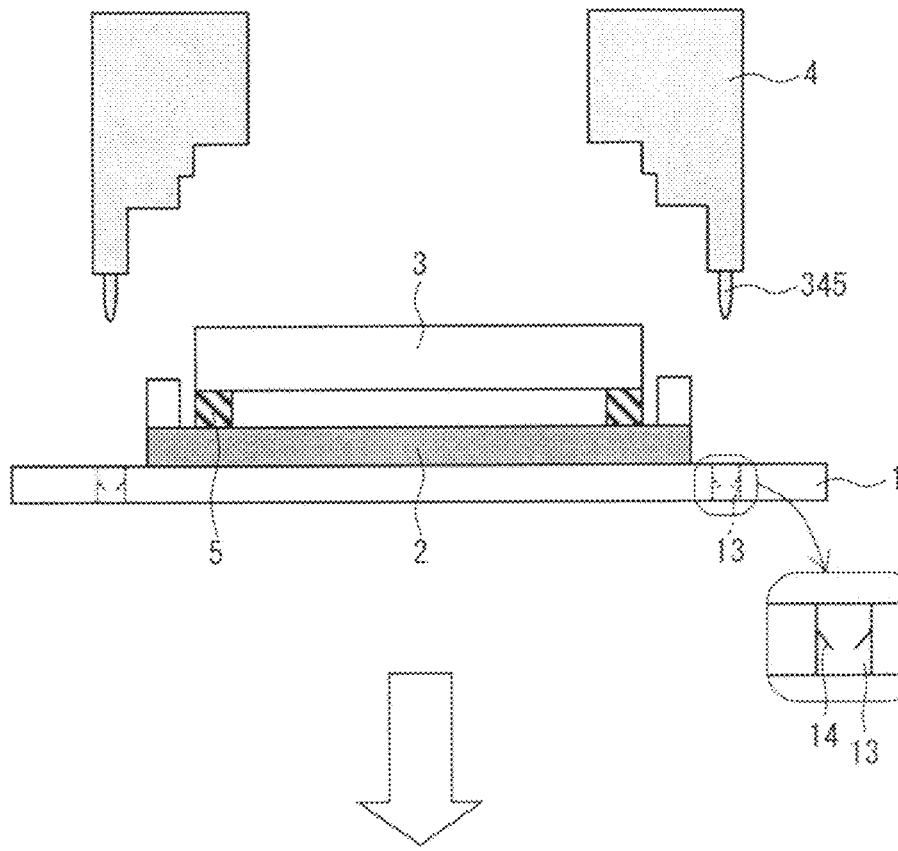
FIG. 27 is a cross-sectional view of exemplary electrical connection between a wiring board and a holder in the solid image capture device shown in FIG. 20.
Figure 27:
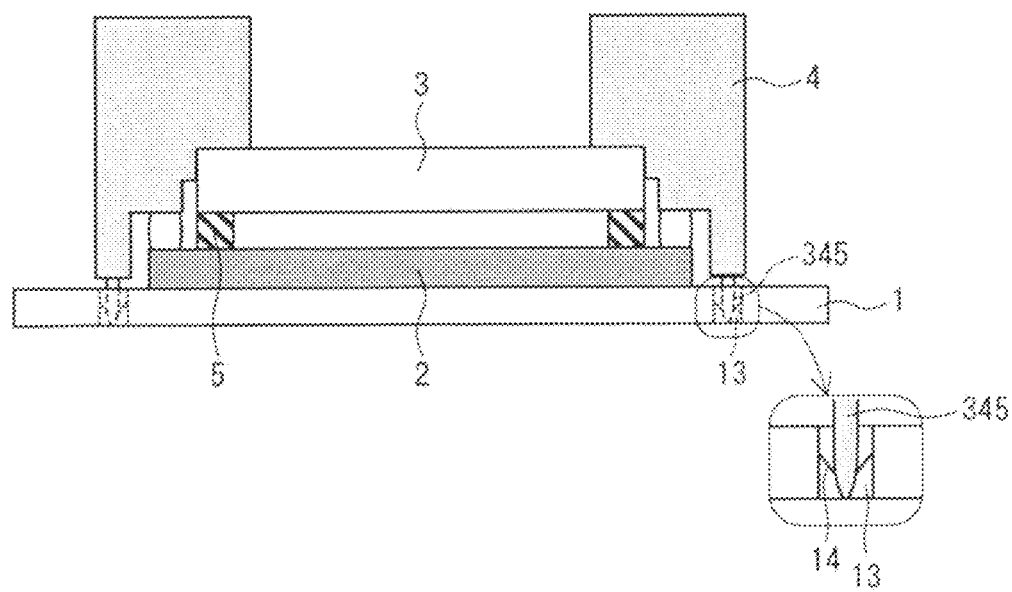
Figure 28:
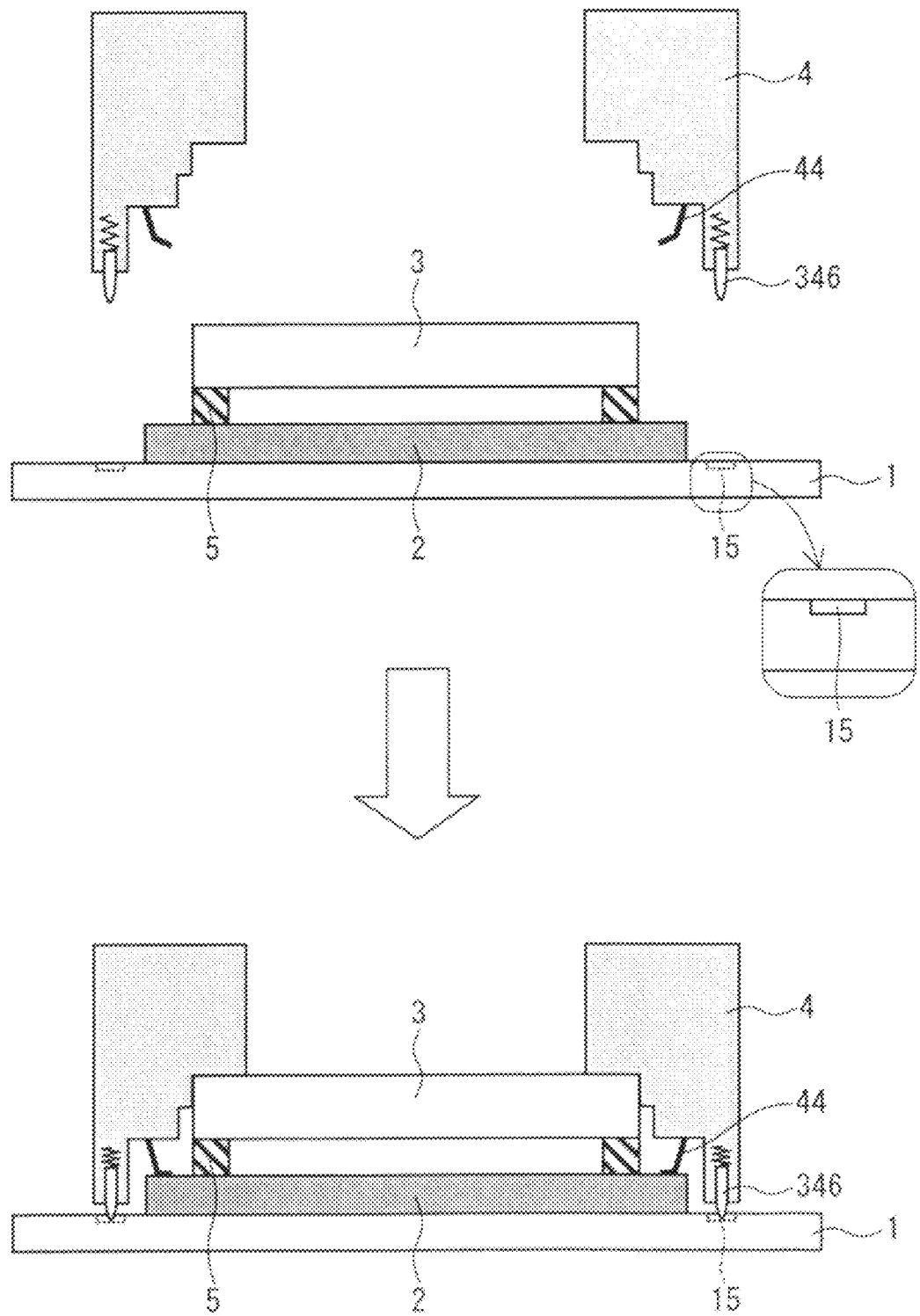
FIG. 28 is a cross-sectional view of exemplary electrical connection between a wiring board and a holder in the solid image capture device shown in FIG. 20.
Figure 29:
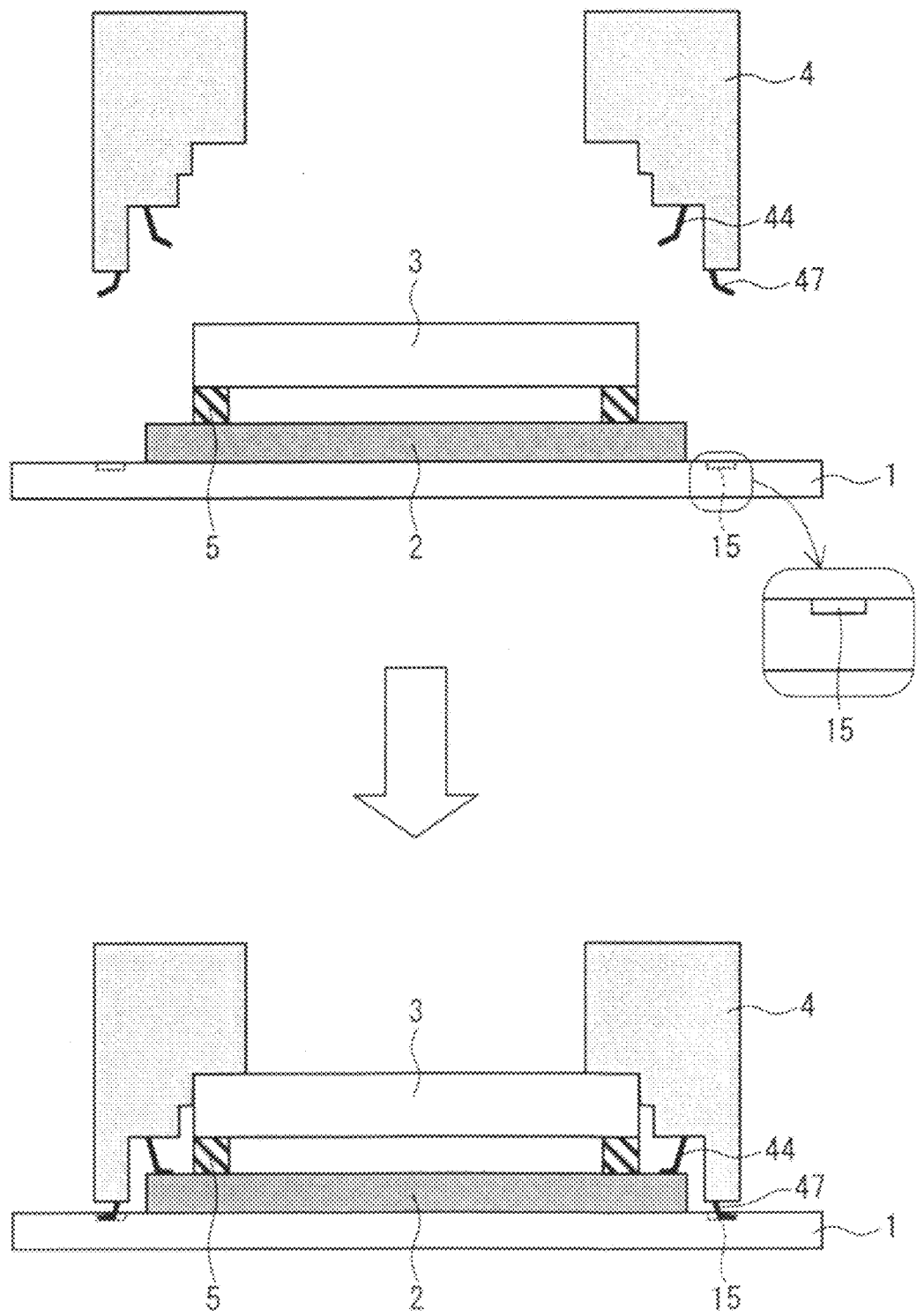
FIG. 29 is a cross-sectional view of exemplary electrical connection between a wiring board and a holder in the solid image capture device shown in FIG. 20.

Next will be described electrical connection between the wiring board 1 and the holder 4 in the solid image capture device 300. FIGS. 27 to 29 are cross-sectional views of exemplary electrical connection between the wiring board 1 and the holder 4. Terminals are provided on both the wiring board 1 and the holder 4 in these structures. The terminals on the wiring board 1 come into contact with those on the holder 4 when the holder 4 is anchored to the wiring board 1. The wiring board 1 and the holder 4 are hence electrically connected only when the holder 4 is anchored to the wiring board 1. The structure therefore does not allow electrical connection to be formed between the wiring board 1 and the holder 4 if the holder 4 is mounted to the wiring board 1 in a wrong way. One can hence achieve reliably positioning of the holder 4 on the wiring board 1.

Specifically, in the structure shown in FIG. 27, pin terminals 345 are formed protruding from the bottom of the holder 4. The wiring board 1 is provided with through holes 13 to which the pin terminals 345 are inserted. Probes 14 are provided in each through hole 13 of the wiring board 1. As the holder 4 is anchored to the wiring board 1, the pin terminals 345 fit in the through holes 13 and come into contact with the probes 14, establishing electrical connection between the wiring board 1 and the holder 4.

In the structure shown in FIG. 28, spring-loaded terminals 346 are formed protruding from the bottom of the holder 4. The spring-loaded terminals 346 withdraw into the holder 4 under load. The wiring board 1 is provided with flat terminals 15. As the holder 4 is anchored to the wiring board 1, the spring-loaded terminals 346 contact the terminals 15 on the wiring board 1. As a result, the spring-loaded terminals 346 receive a force moving away from the wiring board 1 and withdraw into the holder 4. The action establishes electrical connection between the wiring board 1 and the holder 4.

The spring-loaded terminals 346 in FIG. 28 are replaced by probe pin terminals 47 in FIG. 29. The probe pin terminals 47 receive pressure building up on the tips of the probe pins, similarly to the probe pin terminals 44. The pressure works in favor of setting up contacts between the probe pin terminals 47 and the terminals 15 formed on the wiring board 1. Apart from that, the tips of the probe pin terminals 47 scratch the terminals 15 on the wiring board 1 upon setting up the contacts, scraping oxidation and various dirt off the surface of the terminals 15 of the wiring board 1. The scraping maintains the contacts between the probe pin terminals 47 and the terminals 15 on the wiring board 1 in good condition. Reliable contacts are thus established between the wiring board 1 and the holder 4 via the probe pin terminals 47.

The provision of the flat terminals 15 on the wiring board 1 as shown in FIGS. 28 and 29 eliminates the need to form the through holes 13 on the wiring board 1 as shown in FIG. 27. That simplifies the structure of the wiring board 1. The holder 4 in FIGS. 27 to 29 may be anchored to the wiring board 1 by any of the structures shown in FIGS. 22 to 24.

Figure 30:
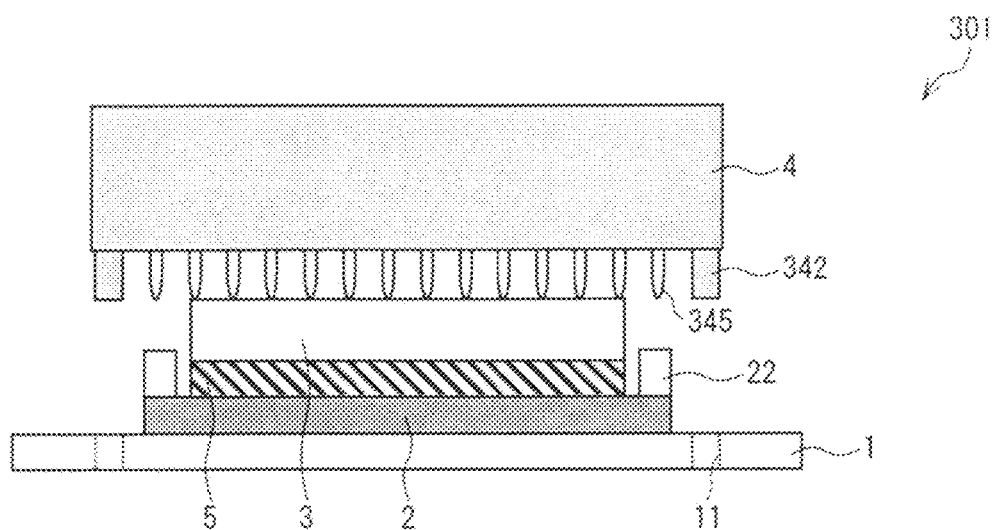
FIG. 30 is a side view and a cross-sectional view of another solid image capture device in accordance with the present invention.
Figure 33:
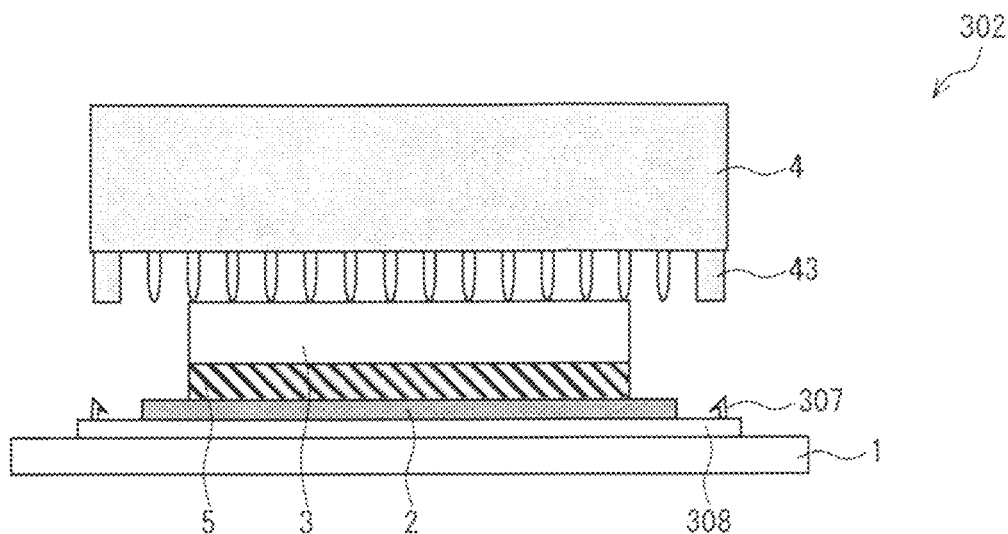
FIG. 33 is a side view and a cross-sectional view of another solid image capture device in accordance with the present invention.

The solid image capture device 300 of the present embodiment may incorporate any suitable combination of the structures in FIGS. 22 to 29, to transmit electrical signals from the solid image capture element 2 to the wiring board 1 via the holder 4. FIGS. 30 and 33 are cross-sectional views of an exemplary combination.

Figure 31:
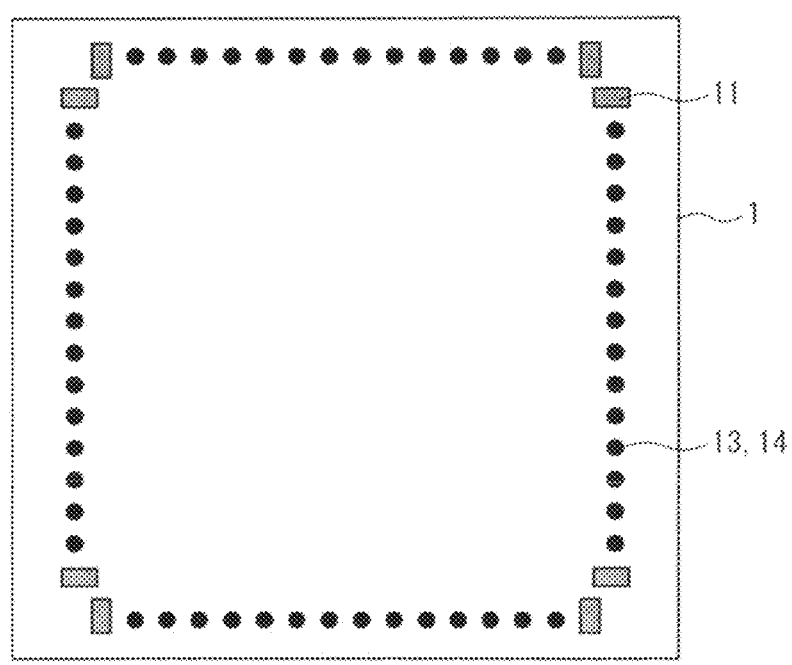
FIG. 31 is a top view of a wiring board in the solid image capture device shown in FIG. 30.
Figure 32:
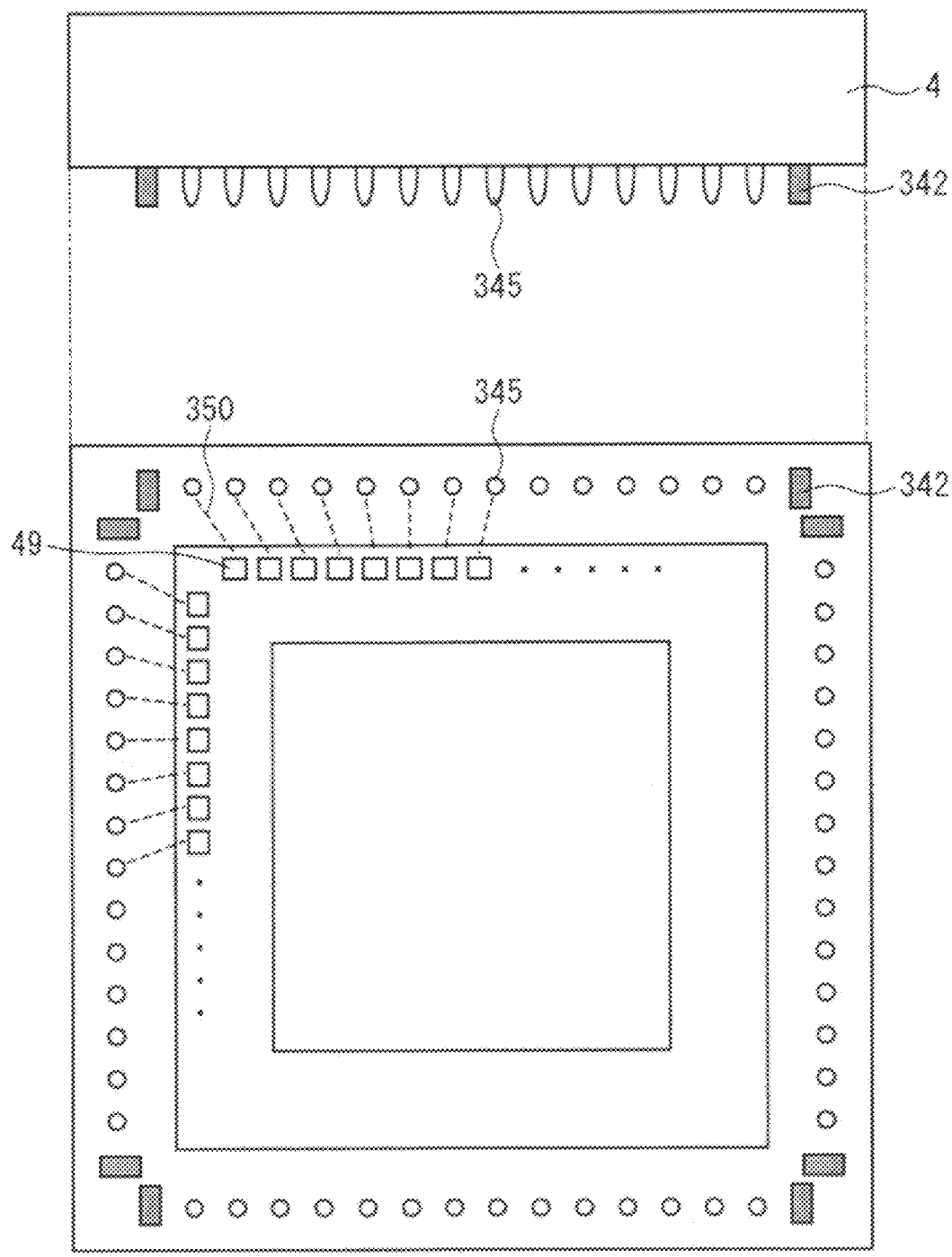
FIG. 32 is a back view of a holder in the solid image capture device shown in FIG. 30.

FIG. 30 depicts a solid image capture device 301 incorporating a combination of the structure shown in FIGS. 22, 26, and 27. In the solid image capture device 301 shown in FIG. 30, the wiring board 1 and the holder 4 are structured, for example, as shown in FIGS. 31 and 32. FIG. 31 is a top view of the wiring board 1 (showing the side facing the holder 4) in the solid image capture device 301 shown in FIG. 30. FIG. 32 is a back view of the holder 4 (showing the side facing wiring board 1) in the solid image capture device 301 shown in FIG. 30. Referring to FIG. 31, the wiring board 1 is provided along its periphery with the notches 11, the through holes 13, and the probes 14. The holder 4 is provided with the hooks 342 formed at sites corresponding to the notches 11 on the wiring board 1 and the pin terminals 345 formed at sites corresponding to the through holes 13 and the probes 14. Therefore, as the holder 4 is placed on the wiring board 1, the hooks 342 engage with the notches 11. At the same time, the pin terminals 345 are inserted into the through holes 13, and the pin terminals 345 come into contact with the probes 14. That establishes electrical connection between the wiring board 1 and the holder 4.

Referring to FIG. 32, terminals 49 are provided inside the area where the pin terminals 345 are formed. The electrically conductive rubber 22 come into contact with the terminals 49 when the holder 4 is placed on the wiring board 1. The pin terminals 345 are connected to the terminals 49 via wires 350.

The structure enables transmission of electrical signals from the solid image capture element 2 sequentially to the electrically conductive rubber 22, the terminals 49, the pin terminals 345, the wiring board 1.

Figure 34:
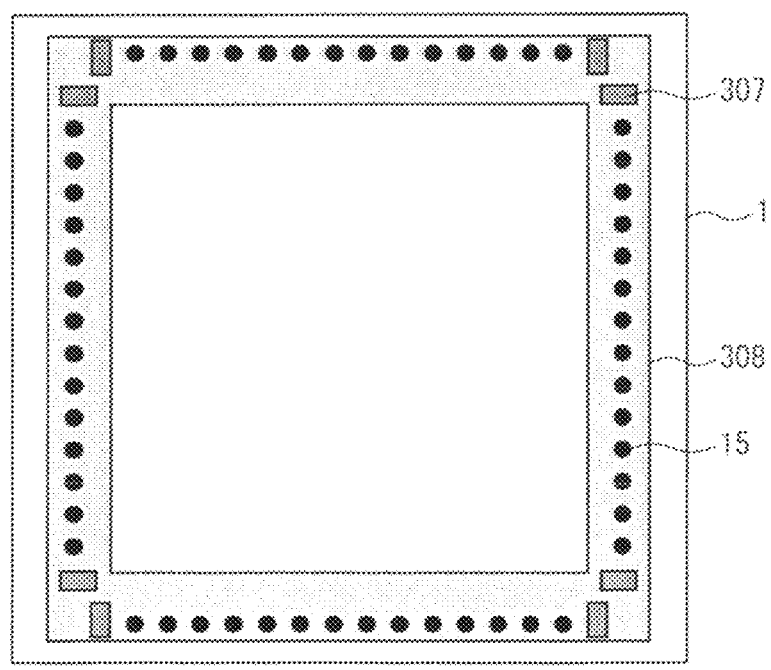
FIG. 34 is a top view of a wiring board and a pedestal in the solid image capture device shown in FIG. 33.

FIG. 33 depicts a solid image capture device 302 incorporating a combination of the pedestal 308 shown in FIG. 24 and the structures shown in FIGS. 25 and 28. FIG. 34 is a top view of the wiring board 1 and the pedestal 308 in the solid image capture device 302 shown in FIG. 33. The solid image capture device 302 is not drawn in a figure because it includes a holder 4 having a similar structure to the one in FIG. 32: differences are found where the notches 43 and the spring-loaded terminals 346 replace the hooks 342 and the pin terminals 345 on the holder 4 in FIG. 32.

The pedestal 308 is provided thereon with the hooks 307 and the terminals 15 as shown in FIG. 34. The holder 4 is provided with the notches 43 (see FIG. 24) at sites corresponding to the hooks 307 on the pedestal 308 and the spring-loaded terminals 346 (see FIG. 28) at sites corresponding to the terminals 15 on the pedestal 308. Therefore, as the holder 4 is placed on the pedestal 308, the hooks 307 engage with the notches 43. At the same time, the spring-loaded terminals 346 come into contact with the terminals 15. That establishes electrical connection between the wiring board 1 and the holder 4.

The structure detailed above enables transmission of electrical signals from the solid image capture element 2 to the wiring board 1 via the holder 4 in the solid image capture devices 301, 302. This description of the structures is however by no means intended to be limiting the scope of the present invention.

Figure 35:
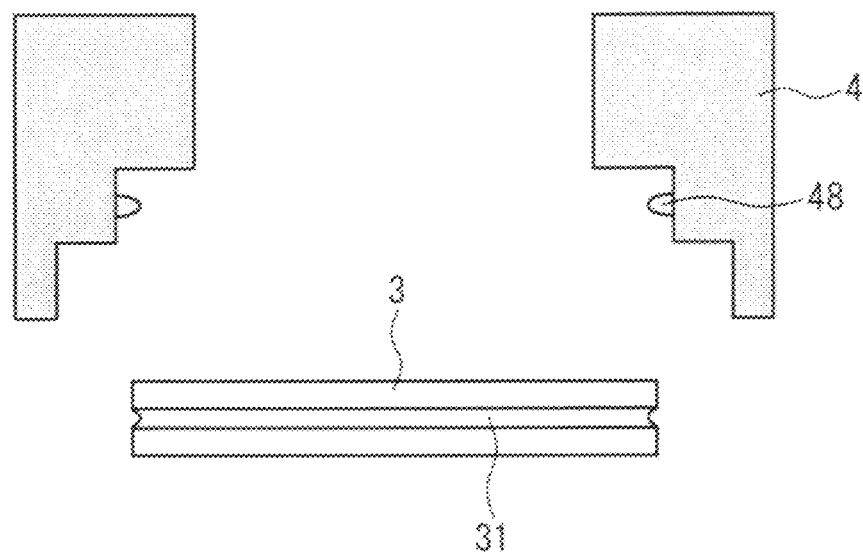
FIG. 35 is a cross-sectional view illustrating how projections provided on a holder fits in a groove provided on side faces of a transparent lid section in a solid image capture device in accordance with the present invention.
Figure 35:
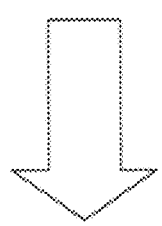
Figure 35:
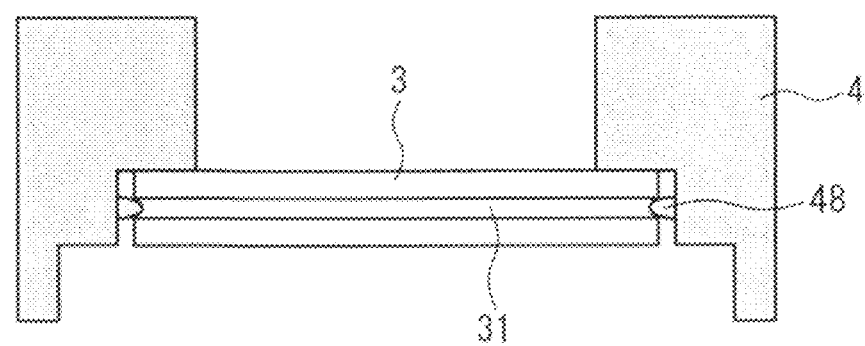
Figure 36:
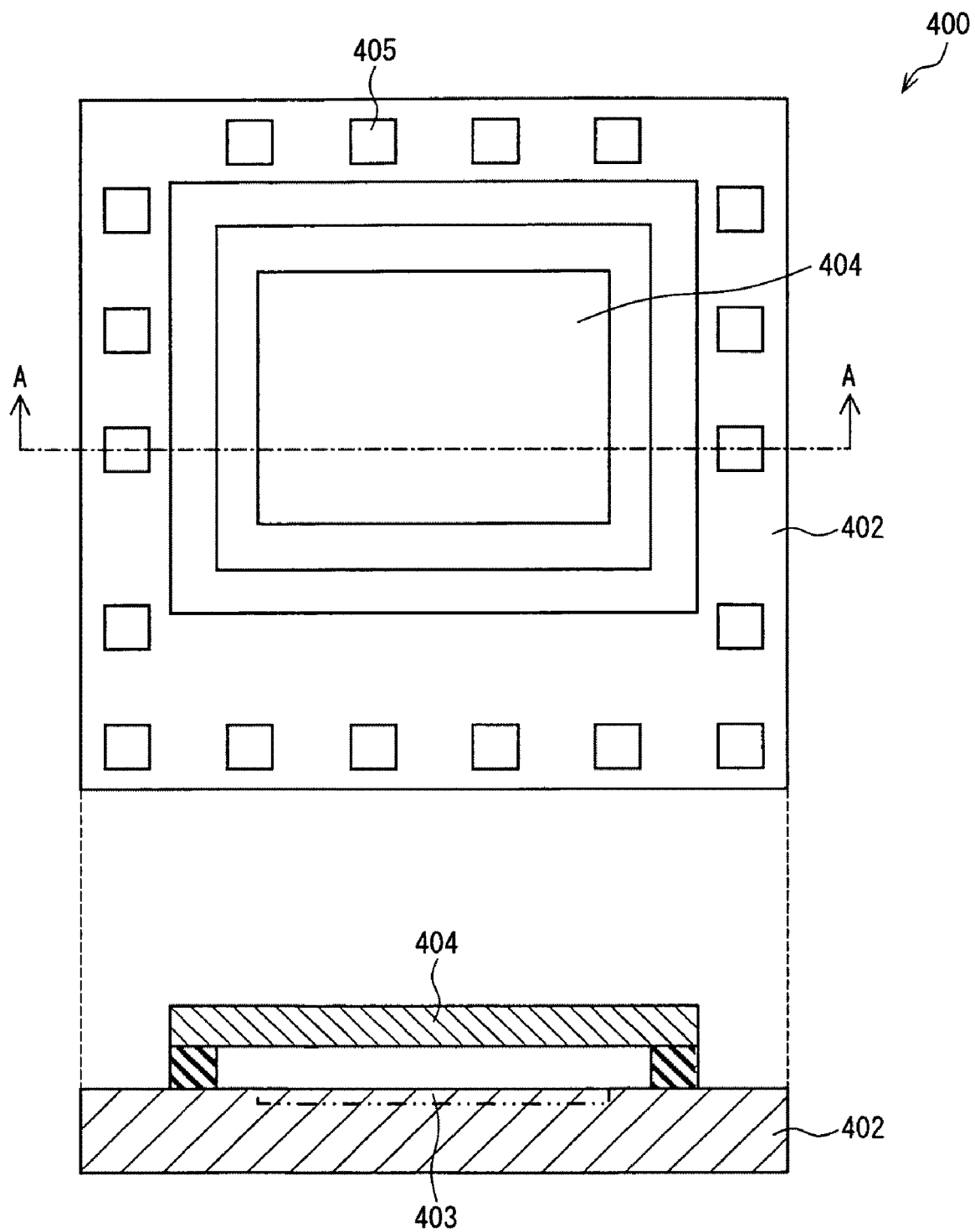
FIG. 36 is a plan view and a cross-sectional view of a solid image capture device according to patent document 1.
Figure 37:
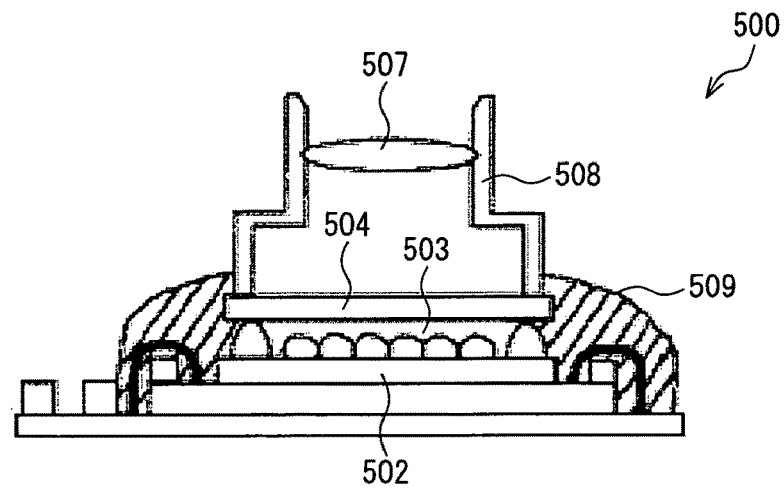
FIG. 37 is a cross-sectional view of a solid image capture device according to patent document 2.
Figure 38:
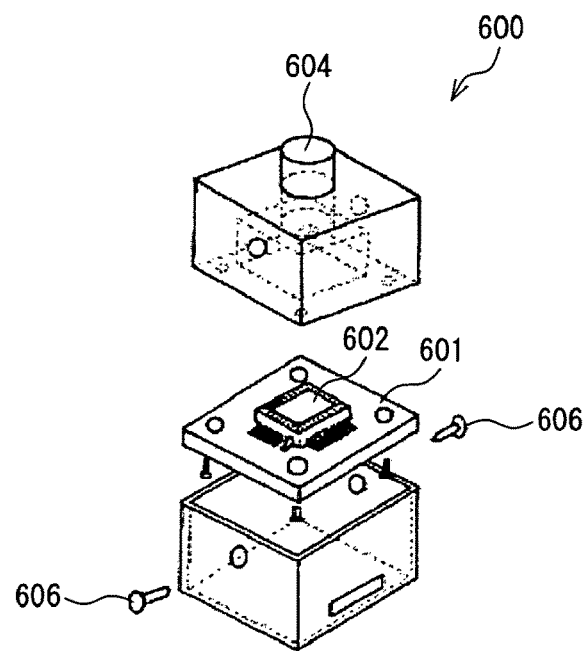
FIG. 38 is an exploded oblique view of a solid image capture device according to patent document 3.
Figure 39:
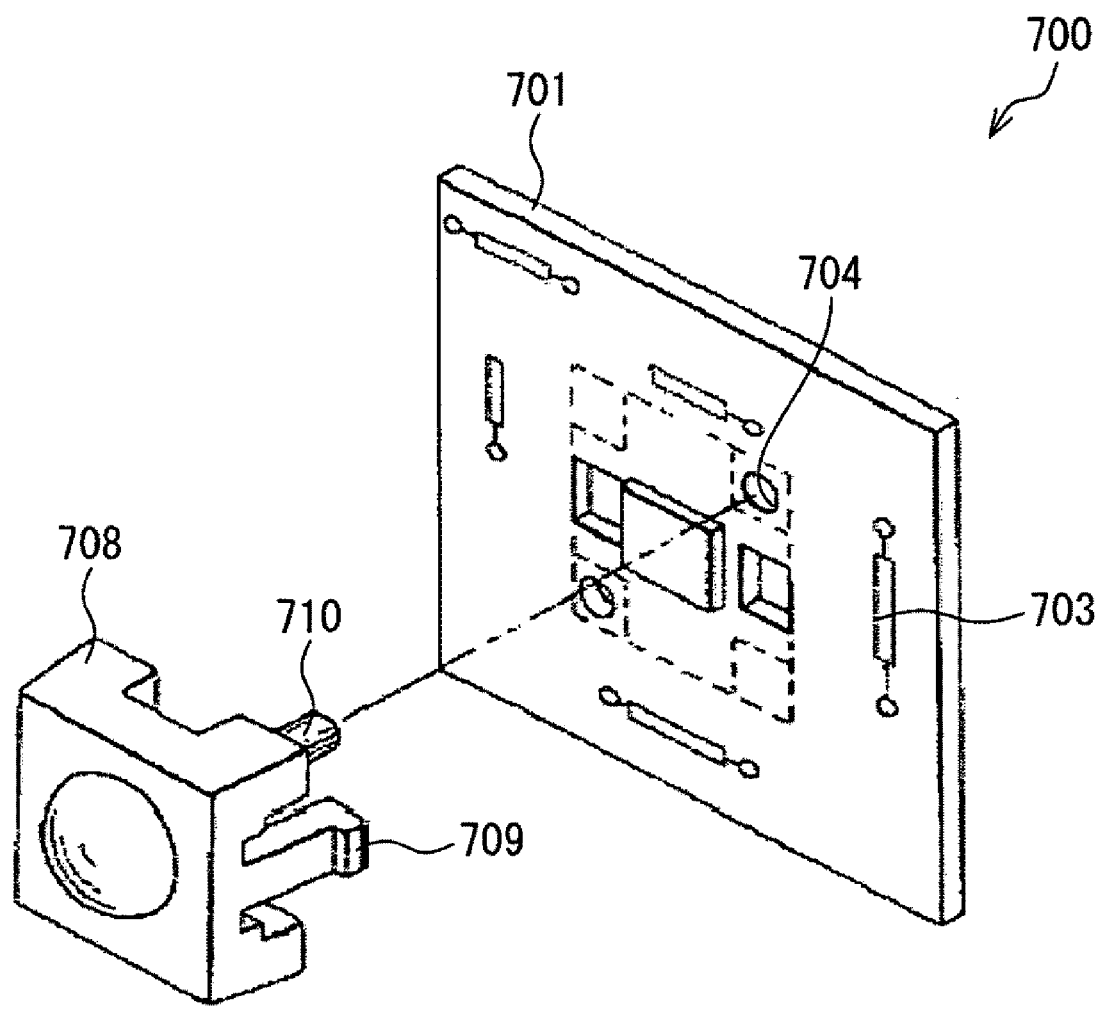
FIG. 39 is an exploded oblique view of a solid image capture device according to patent document 4.

In the foregoing example, the side faces of the transparent lid section 3 were assumed to be flat. Alternatively, the side faces of the transparent lid section 3 may have a groove 31 as shown in FIG. 35, and the holder 4 may have projections 48 which fit in the groove 31 when the holder 4 is anchored to the wiring board 1. The mechanism enables high precision placement of the holder 4 and the solid image capture element 2 on the wiring board 1.

The solid image capture device in accordance with the present invention is suited for application in camera-equipped mobile phones, digital still cameras, video camera, security cameras, like electronic imaging devices. The structures detailed above enable the solid image capture device to be reliably attached and fixed to the image capture section of the electronic devices.

The present invention is not limited to the description of the embodiments above, but may be altered by a skilled person within the scope of the claims. An embodiment based on a proper combination of technical means disclosed in different embodiments is encompassed in the technical scope of the present invention.

The present invention is applicable to various electronic devices incorporating a solid image capture device, such as camera-equipped mobile phones, digital still cameras, and surveillance/security cameras for the door phone system.

What is claimed is:

1. A solid image capture device, comprising:
a solid image capture element;
a wiring board to which the solid image capture element is mounted, the wiring board including wiring for electrical connection with the solid image capture element;
a transparent lid section provided over the solid image capture element to cover a light receiving section of the solid image capture element with a gap being left between the transparent lid section and the light receiving section;
a lens directing external light to the light receiving section of the solid image capture element;
a lens barrel accommodating the lens; and
a holder securing the lens barrel onto the transparent lid section,
wherein
the holder presses the lens barrel when the holder is in engagement with an external section of the transparent lid section, to secure the lens barrel onto the transparent lid section;
the holder is provided on the wiring board to encase therein the solid image capture element; and
the holder is detachably secured to the wiring board and applies pressure to side faces of the transparent lid section in a direction normal to the side faces, to tightly hold the transparent lid section, and
the holder includes:
contact sections each provided for a different one of the side faces of the transparent lid section to come into contact with that side face;
lock sections detachably secured to the wiring board to pivotally support the contact sections; and
a frame securing the contact sections when fit around the contact sections.

2. A solid image capture device, comprising:
a solid image capture element;
a wiring board to which the solid image capture element is mounted, the wiring board including wiring for electrical connection with the solid image capture element;
a transparent lid section provided over the solid image capture element to cover a light receiving section of the solid image capture element with a gap being left between the transparent lid section and the light receiving section;
a lens directing external light to the light receiving section of the solid image capture element;
a lens barrel accommodating the lens; and
a holder securing the lens barrel onto the transparent lid section,
wherein
the holder presses the lens barrel when the holder is in engagement with an external section of the transparent lid section, to secure the lens barrel onto the transparent lid section;
the holder is provided on the wiring board to encase therein the solid image capture element; and
the holder is detachably secured to the wiring board and applies pressure to side faces of the transparent lid section in a direction normal to the side faces, to tightly hold the transparent lid section; and
wherein
either the holder or the solid image capture element has a connecting section for electrical connection between the holder and the solid image capture element; and
the connecting section comes into contact with the holder and the solid image capture element when the transparent lid section is tightly held by the holder.

3. The solid image capture device as set forth in claim 1, wherein:
the holder is provided on the wiring board to encase therein the solid image capture element; and
the holder is anchored to the wiring board to hold down the transparent lid section in a direction normal to a light receiving surface of the solid image capture element toward the solid image capture element.

4. The solid image capture device as set forth in claim 3, wherein:
either the holder or the solid image capture element has a connecting section for electrical connection between the holder and the solid image capture element; and
the connecting section comes into contact with the holder and the solid image capture element when the holder is anchored to the wiring board.

5. The solid image capture device as set forth in claim 3, wherein:
both the wiring board and the holder have terminals; and
the terminals of the wiring board and those of the holder come into contact when the holder is anchored to the wiring board.

6. The solid image capture device as set forth in claim 2, wherein the connecting section is probe pin terminals.

7. The solid image capture device as set forth in claim 4, wherein the connecting section is probe pin terminals.

8. The solid image capture device as set forth in claim 2, wherein the connecting section is electrically conductive rubber.

9. The solid image capture device as set forth in claim 5, wherein the connecting section is electrically conductive rubber.

10. The solid image capture device as set forth in claim 1, wherein:
the transparent lid section has a groove formed on the side faces thereof; and
the holder has projections which are anchored in the groove.

11. The solid image capture device as set forth in claim 3, wherein:
the transparent lid section has a groove formed on the side faces thereof; and
the holder has projections which are anchored in the groove.

12. The solid image capture device as set forth in claim 1, wherein the holder comes into contact with a top face of the transparent lid section when the holder is in engagement with the external section of the transparent lid section.

13. The solid image capture device as set forth in claim 1, wherein:
the lens barrel has a flange section on a bottom section thereof; and
the holder presses the flange section when the holder is in engagement with the external section of the transparent lid section, to secure the lens barrel onto the transparent lid section.

14. The solid image capture device as set forth in claim 1, wherein:
the lens barrel has a flange section on a bottom section thereof; and
the frame comes into contact with the flange section and a top face of the transparent lid section when the frame is fit around an external section of the contact sections.

15. The solid image capture device as set forth in claim 3, wherein:
the lens barrel has a flange section on a bottom section thereof; and
the holder comes into contact with a periphery of the transparent lid section and the flange section when the holder is anchored to the wiring board.

16. An electronic device, comprising
a solid image capture device including:
a solid image capture element;
a wiring board to which the solid image capture element is mounted, the wiring board including wiring for electrical connection with the solid image capture element;
a transparent lid section provided over the solid image capture element to cover a light receiving section of the solid image capture element with a gap being left between the transparent lid section and the light receiving section;
a lens directing external light to the light receiving section of the solid image capture element;
a lens barrel accommodating the lens; and
a holder securing the lens barrel onto the transparent lid section,
wherein
the holder presses the lens barrel when the holder is in engagement with an external section of the transparent lid section, to secure the lens barrel onto the transparent lid section;
the holder is provided on the wiring board to encase therein the solid image capture element; and
the holder is detachably secured to the wiring board and applies pressure to side faces of the transparent lid section in a direction normal to the side faces, to tightly hold the transparent lid section, and
the holder includes:
contact sections each provided for a different one of the side faces of the transparent lid section to come into contact with that side face;
lock sections detachably secured to the wiring board to pivotally support the contact sections; and
a frame securing the contact sections when fit around the contact sections.

17. An electronic device, comprising
a solid image capture device, including:
a solid image capture element;
a wiring board to which the solid image capture element is mounted, the wiring board including wiring for electrical connection with the solid image capture element;
a transparent lid section provided over the solid image capture element to cover a light receiving section of the solid image capture element with a gap being left between the transparent lid section and the light receiving section;
a lens directing external light to the light receiving section of the solid image capture element;
a lens barrel accommodating the lens; and
a holder securing the lens barrel onto the transparent lid section, wherein
- the holder presses the lens barrel when the holder is in engagement with an external section of the transparent lid section, to secure the lens barrel onto the transparent lid section;
- the holder is provided on the wiring board to encase therein the solid image capture element; and
- the holder is detachably secured to the wiring board and applies pressure to side faces of the transparent lid section in a direction normal to the side faces, to tightly hold the transparent lid section; and wherein
- either the holder or the solid image capture element has a connecting section for electrical connection between the holder and the solid image capture element; and
- the connecting section comes into contact with the holder and the solid image capture element when the transparent lid section is tightly held by the holder.

* * * * *